(12) United States Patent
Kanekawa et al.

(10) Patent No.: US 6,624,474 B2
(45) Date of Patent: Sep. 23, 2003

(54) SEMICONDUCTOR DEVICE WITH SCALABLE WITHSTANDING VOLTAGE

(75) Inventors: Nobuyasu Kanekawa, Hitachi (JP); Kohei Sakurai, Hitachi (JP); Shoji Sasaki, Hitachinaka (JP); Kenji Tabuchi, Hitachinaka (JP); Mitsuru Watabe, Urizura (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/943,384

(22) Filed: Aug. 31, 2001

(65) Prior Publication Data

US 2002/0109186 A1 Aug. 15, 2002

(30) Foreign Application Priority Data

Feb. 15, 2001 (JP) .......................... 2001-038685

(51) Int. Cl.[7] .................... H01L 27/01; H04L 25/02
(52) U.S. Cl. ...................... 257/347; 307/113
(58) Field of Search ................ 257/396–399, 257/496, 510, 513, 521, 586, 594, 618, 622, 626, 347, 350; 307/113, 127, 141.8; 326/21, 82; 327/24, 28, 31

(56) References Cited

U.S. PATENT DOCUMENTS 5,594,379 A * 1/1997 Kiraly .................. 327/381

FOREIGN PATENT DOCUMENTS

| JP | 11-136293 | 5/1999 |
| JP | 11-317445 | 11/1999 |

OTHER PUBLICATIONS

Article entitled "Application Technique of Power MOSFET" by Hiroshi Yamazaki, issued by Nikkan Industry Newspaper Co., pp. 55–57.

* cited by examiner

Primary Examiner—Minh Loan Tran
Assistant Examiner—Thomas L Dickey
(74) Attorney, Agent, or Firm—Crowell & Moring LLP

(57) ABSTRACT

A semiconductor device comprises an embedded insulation layer 101 formed on a semiconductor substrate 100, plural power semiconductor elements 2, 3 formed on a semiconductor substrate 100 on the embedded insulation layer, a trench 4 formed on the semiconductor substrate and isolating between the power semiconductor elements, and an isolator 5 insulating and driving control electrodes of the power semiconductor elements, and the power semiconductor elements 2, 3 such as transistors can be used, being connected each other in series.

11 Claims, 20 Drawing Sheets

| IN1 | IN2 | O1 | O2 |
|---|---|---|---|
| L | L | L | L |
| L | H | L | H |
| H | L | H | L |
| H | H | L | L |

| IN1 | O1 | O2 |
|---|---|---|
| L | L | L |
| H | H | H |

FIG. 27

| LSI | CHAN-NEL | WITHSTAND VOLTAGE | | ON RESISTANCE | | USE | | |
|---|---|---|---|---|---|---|---|---|
| | | | | | | FOR 4 CYLINDERS | FOR 6 CYLINDERS | FOR 8 CYLINDERS |
| 1 | 1a | 40V | 80V | 0.3Ω | 0.6Ω | INJECTOR 1 | INJECTOR 1 | INJECTOR 1 |
| | 1b | 40V | | 0.3Ω | | | | |
| | 2a | 40V | 80V | 0.3Ω | 0.6Ω | INJECTOR 2 | INJECTOR 2 | INJECTOR 2 |
| | 2b | 40V | | 0.3Ω | | | | |
| | 3a | 40V | 80V | 0.3Ω | 0.6Ω | INJECTOR 3 | INJECTOR 3 | INJECTOR 3 |
| | 3b | 40V | | 0.3Ω | | | | |
| | 4a | 40V | 80V | 0.3Ω | 0.6Ω | INJECTOR 4 | INJECTOR 4 | INJECTOR 4 |
| | 4b | 40V | | 0.3Ω | | | | |
| | 5a | 40V | 80V | 0.3Ω | 0.6Ω | LOW PRES. LOAD | INJECTOR 5 | LOW PRES. LOAD |
| | 5b | 40V | | 0.3Ω | | LOW PRES. LOAD | | LOW PRES. LOAD |
| | 6a | 40V | 80V | 0.3Ω | 0.6Ω | LOW PRES. LOAD | INJECTOR 6 | LOW PRES. LOAD |
| | 6b | 40V | | 0.3Ω | | LOW PRES. LOAD | | LOW PRES. LOAD |
| | 7~n | 40V | | 0.3Ω | | LOW PRES. LOAD | LOW PRES. LOAD | LOW PRES. LOAD |
| 2 | 1a | 40V | 80V | 0.3Ω | 0.6Ω | | | INJECTOR 5 |
| | 1b | 40V | | 0.3Ω | | | | |
| | 2a | 40V | 80V | 0.3Ω | 0.6Ω | | | INJECTOR 6 |
| | 2b | 40V | | 0.3Ω | | | | |
| | 3a | 40V | 80V | 0.3Ω | 0.6Ω | | | INJECTOR 7 |
| | 3b | 40V | | 0.3Ω | | | | |
| | 4a | 40V | 80V | 0.3Ω | 0.6Ω | | | INJECTOR 8 |
| | 4b | 40V | | 0.3Ω | | | | |
| | 5a | 40V | 80V | 0.3Ω | 0.6Ω | | | LOW PRES. LOAD |
| | 5b | 40V | | 0.3Ω | | | | LOW PRES. LOAD |
| | 6a | 40V | 80V | 0.3Ω | 0.6Ω | | | LOW PRES. LOAD |
| | 6b | 40V | | 0.3Ω | | | | LOW PRES. LOAD |
| | 7~n | 40V | | 0.3Ω | | | | LOW PRES. LOAD |

FIG. 28

| LSI | CHANNEL | WITHSTAND VOLTAGE | ON RESISTANCE | | USE | | |
|---|---|---|---|---|---|---|---|
| | | | | | FOR 4 CYLINDERS | FOR 6 CYLINDERS | FOR 8 CYLINDERS |
| 1 | 1 | 80V | 0.6Ω | | INJECTOR 1 | INJECTOR 1 | INJECTOR 1 |
| | 2 | 80V | 0.6Ω | | INJECTOR 2 | INJECTOR 2 | INJECTOR 2 |
| | 3 | 80V | 0.6Ω | | INJECTOR 3 | INJECTOR 3 | INJECTOR 3 |
| | 4 | 80V | 0.6Ω | | INJECTOR 4 | INJECTOR 4 | INJECTOR 4 |
| | 5a | 40V | 80V | 0.3Ω | 0.6Ω | LOW PRES. LOAD | INJECTOR 5 | LOW PRES. LOAD |
| | 5b | 40V | | 0.3Ω | | LOW PRES. LOAD | | LOW PRES. LOAD |
| | 6a | 40V | 80V | 0.3Ω | 0.6Ω | LOW PRES. LOAD | INJECTOR 6 | LOW PRES. LOAD |
| | 6b | 40V | | 0.3Ω | | LOW PRES. LOAD | | LOW PRES. LOAD |
| | 7~n | 40V | 0.3Ω | | LOW PRES. LOAD | LOW PRES. LOAD | LOW PRES. LOAD |
| 2 | 1 | 80V | 0.6Ω | | | | INJECTOR 5 |
| | 2 | 80V | 0.6Ω | | | | INJECTOR 6 |
| | 3 | 80V | 0.6Ω | | | | INJECTOR 7 |
| | 4 | 80V | 0.6Ω | | | | INJECTOR 8 |
| | 5a | 40V | 80V | 0.3Ω | 0.6Ω | | | LOW PRES. LOAD |
| | 5b | 40V | | 0.3Ω | | | | LOW PRES. LOAD |
| | 6a | 40V | 80V | 0.3Ω | 0.6Ω | | | LOW PRES. LOAD |
| | 6b | 40V | | 0.3Ω | | | | LOW PRES. LOAD |
| | 7~n | 40V | 0.3Ω | | | | LOW PRES. LOAD |

FIG. 29

| LSI | CHAN-NEL | WITHSTAND VOLTAGE | | USE | | |
|---|---|---|---|---|---|---|
| | | | | FOR 4 CYLINDERS | FOR 6 CYLINDERS | FOR 8 CYLINDERS |
| 1 | 1 | 400V | | IGNITER 1 | IGNITER 1 | IGNITER 1 |
| | 2 | 400V | | IGNITER 2 | IGNITER 2 | IGNITER 2 |
| | 3 | 400V | | IGNITER 3 | IGNITER 3 | IGNITER 3 |
| | 4 | 400V | | IGNITER 4 | IGNITER 4 | IGNITER 4 |
| | 5a | 40V | 400V | LOW PRES. LOAD | IGNITER 5 | LOW PRES. LOAD |
| | 5j | 40V | | LOW PRES. LOAD | | LOW PRES. LOAD |
| | 6a | 40V | 400V | LOW PRES. LOAD | IGNITER 6 | LOW PRES. LOAD |
| | 6j | 40V | | LOW PRES. LOAD | | LOW PRES. LOAD |
| | 7~n | 40V | | LOW PRES. LOAD | LOW PRES. LOAD | LOW PRES. LOAD |
| 2 | 1 | 400V | | | | IGNITER 5 |
| | 2 | 400V | | | | IGNITER 6 |
| | 3 | 400V | | | | IGNITER 7 |
| | 4 | 400V | | | | IGNITER 8 |
| | 5a | 40V | 400V | | | LOW PRES. LOAD |
| | 5j | 40V | | | | LOW PRES. LOAD |
| | 6a | 40V | 400V | | | LOW PRES. LOAD |
| | 6j | 40V | | | | LOW PRES. LOAD |
| | 7~n | 40V | | | | LOW PRES. LOAD |

FIG. 30

| LSI | CHAN-NEL | WITHSTAND VOLTAGE | | ON RESISTANCE | | USE | | |
|---|---|---|---|---|---|---|---|---|
| | | | | | | 14(12) V SYSTEM | 42V SYSTEM | MIXED BOTH SYSTEMS |
| 1 | 1a | 40V | 80V | 0.3Ω | 0.6Ω | 14(12) V SYSTEM LOAD | 42V SYSTEM LOAD | 42V SYSTEM LOAD |
| | 1b | 40V | | 0.3Ω | | 14(12) V SYSTEM LOAD | | |
| | 2a | 40V | 80V | 0.3Ω | 0.6Ω | 14(12) V SYSTEM LOAD | 42V SYSTEM LOAD | 42V SYSTEM LOAD |
| | 2b | 40V | | 0.3Ω | | 14(12) V SYSTEM LOAD | | |
| | 3a | 40V | 80V | 0.3Ω | 0.6Ω | 14(12) V SYSTEM LOAD | 42V SYSTEM LOAD | 42V SYSTEM LOAD |
| | 3b | 40V | | 0.3Ω | | 14(12) V SYSTEM LOAD | | |
| | 4a | 40V | 80V | 0.3Ω | 0.6Ω | 14(12) V SYSTEM LOAD | 42V SYSTEM LOAD | 42V SYSTEM LOAD |
| | 4b | 40V | | 0.3Ω | | 14(12) V SYSTEM LOAD | | |
| | ⋮ | | | | | | | |
| | na | 40V | 80V | 0.3Ω | 0.6Ω | 14(12) V SYSTEM LOAD | 42V SYSTEM LOAD | 14(12) V SYSTEM LOAD |
| | nb | 40V | | 0.3Ω | | 14(12) V SYSTEM LOAD | | 14(12) V SYSTEM LOAD |

SEMICONDUCTOR DEVICE WITH SCALABLE WITHSTANDING VOLTAGE

BACKGROUND OF THE INVENTION

1. Technical Field of the Invention

The present invention relates to a semiconductor device and, more particularly, to a semiconductor circuit in which semiconductor drivers of different withstand voltage are mixed and disposed within the same chip.

2. Prior Art

A semiconductor switch is used widely instead of a conventional relay and mechanical switch because it is small in size, capable of high speed operation and long in life. As indications representative of the performance of the semiconductor switch, there are withstand voltage, current capacity and on-resistance. By increasing the withstand voltage and current capacity, it is possible to increase treatable power which is a product of them. Further, by reducing the on-resistance, it is possible to decrease heat generation of the semiconductor switch and increase the current capacity under the same heat circumference. Thereby, the energy efficiency can be increased.

The technique for improvement of withstand voltage and current capacity of MOSFET used generally as a semiconductor switch is disclosed in "Application Technique of Power MOSFET" by Hiroshi Yamazaki, issued by Nikkan Industry Newspaper Co. pp. 55–57.

There is an intimate relationship between the withstand voltage and on-resistance of the MOSFET, and according to the above-mentioned literature page 55, there is the following relationship between on-resistance and withstand voltage of unit chip area of a power MOSFET:

$$Rds \text{ (on)/unit chip area} \varpropto BVds^{2.4-2.7}$$

where Rds (on) is on-resistance between a drain and a source, and BVds is yield voltage between drain and source. That is, it is noted that when the withstand voltage is increased, the on-resistance increases rapidly in proportion to the 2.4 to 2.7th power of the withstand voltage. Namely, when the element is made so as to have withstand voltage more than the necessity, the on-resistance increases. From this fact, for the power MOSFET, design for optimum withstand voltage meeting with an intended use is important in order to decrease power loss and obtain high efficiency.

Further, in a lateral type power MOSFET, since yield voltage between the drain and the source is proportional to a distance between the drain and source, when the element is made so as to have withstand voltage more than the necessary voltage, a chip area increases. Therefore, the design for optimum withstand voltage meeting with an intended use is important also from a viewpoint of reduction of the chip area.

SUMMARY OF THE INVENTION

However, the conventional technique that design and manufacture of a power MOSFET are conducted on the basis of the withstand voltage specification met with an object for its use has the following problems:

(1) Increase of Kinds

The withstand voltage required for a semiconductor element opening and closing a pure resistance load is determined almost by a power supply voltage. According thereto, it is sufficient to prepare a semiconductor element which has withstand voltage corresponding to the power supply voltage. However, the power supply voltage has many different values, so that it is necessary to prepare many kinds of semiconductor elements for only this reason. Therefore, it results to be production of small quantities and many kinds, and a mass production effect can not be brought about.

Further, current is interrupted and flowed for an inductive load such as a motor, a solenoid, etc., whereby counter electromotive force which is L·di/dt occurs and the withstand voltage required by the counter electromotive force is determined in many cases. Therefore, it is necessary to prepare semiconductor elements of various kinds according to multiplicity of reactance L and current change ratios di/dt in addition the multiplicity by power supply voltage, thus the mass production effect can not be brought about further.

(2) Bar to Integration

As mentioned above, in the semiconductor element having inductive load, even if power supply voltage is the same, the withstand voltage required for the load differs according to counter electromotive force of L·di/dt. For example, on the primary side of an ignition coil of a vehicle engine, although power supply voltage is 12V, the counter electromotive force of the ignition coil reaches several hundreds voltages V, therefore, a semiconductor element having withstand voltage corresponding thereto is necessary for switching.

Further, in the case where drivers formed of a plurality of semiconductor elements are integrated to make the size of a controller small, it is necessary to make each driver have different withstand voltages. In a vertical type MOSFET, a distance between the source and the drain, which influence the withstand voltage, depends on the thickness of a substrate, so that it is structurally impossible to make the same chip have different withstand voltage. Further, in a lateral type MOSFET, a distance from a semiconductor substrate is limited inherently, however, as for a distance between the source and the drain, any distance can be taken in a horizontal direction. However, since diffusion depth and density are necessary to change according to the withstand voltage in order to obtain an optimum characteristic, the number of steps and the number of masks necessary for production increase, whereby a production cost increases, further, a yield rate decreases as the number of steps increases.

The present invention is made in view of the above-mentioned problems, and an object of the present invention is to make it possible to integrate, on the same chip, a plurality of semiconductor drivers having different withstand voltage, thereby to provide semiconductor drivers which can meet various withstand voltage in small kinds, and suppress an increase of the number of kinds of chips due to multiplicity of the withstand voltage.

A semiconductor device according to the present invention which achieves the above-mentioned object, comprises: an embedded insulation layer formed in a semiconductor substrate, a trench isolating between a plurality of power semiconductor elements formed on the semiconductor substrate on the embedded insulation layer and the power semiconductor elements, and an isolator insulating and driving control electrodes of the power semiconductor elements, the above-mentioned semiconductor elements such as transistors can be used, being connected each other in series.

BRIEF DESCRIPTION OF THE DRAWINGS

FIG. 27 is a table showing an example of specifications of drivers LSI suitable for engine control and methods of using them;

FIG. 28 is a table showing another example of specifications of drivers LSI suitable for engine control and methods of using them;

FIG. 29 is a table showing further another example of specifications of drivers LSI suitable for engine control and methods of using them;

FIG. 30 is a table showing an example of specifications of drivers LSI suitable for driving apparatus of electric equipment and methods of using them;

EXPLANATION OF SYMBOLS USED IN THE FIGURES

Figure 1:
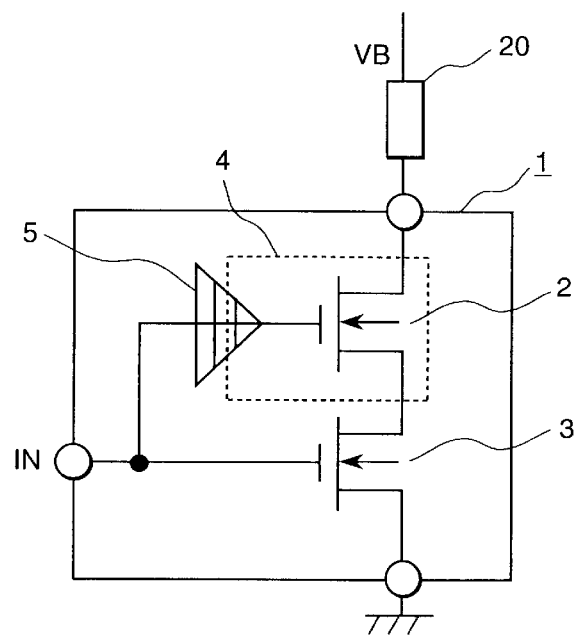
FIG. 1 is a diagram for explanation of a driver LSI of an embodiment of the present invention.

1 . . . driver LSI, 2, 3, 3' . . . transistor, 4 . . . trench, 5 . . . isolator, 6 . . . charge pump, 7 . . . gate control circuit, 11 . . . input control circuit, 12 . . . communication interface, 13 . . . communication port, 14 . . . register, 15 . . . timer, 16 . . . selector, 20, 20' . . . load, 100 . . . semiconductor substrate, 101, 102 insulation layer, 103 . . . conductor.

DESCRIPTION OF EMBODIMENTS OF THE INVENTION

Hereunder, embodiments of the present invention will be explained hereunder, referring to the drawings.

Figure 2:
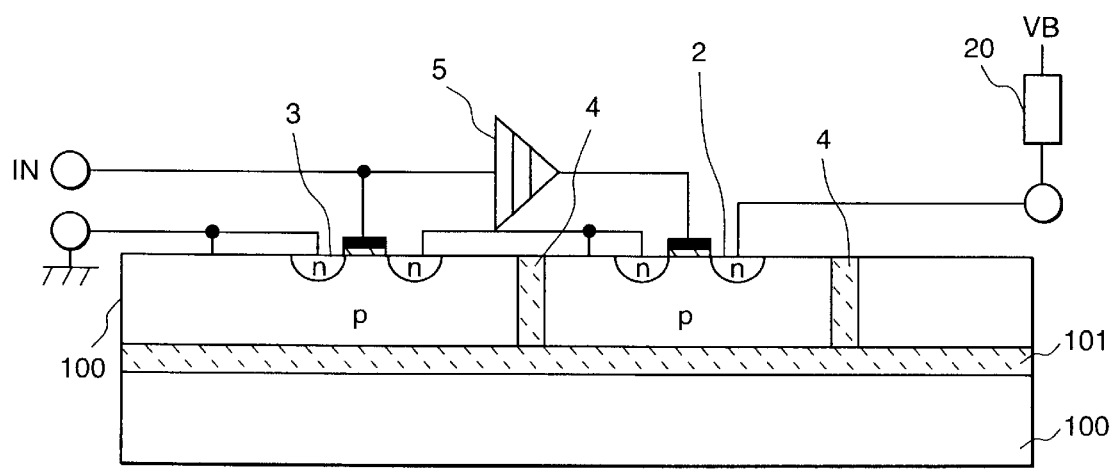
FIG. 2 is a sectional view of the driver LSI.

A first embodiment will be explained, referring to FIGS. 1 and 2. FIG. 1 is a diagram showing a driver LSI as a semiconductor device according to the present embodiment, and FIG. 2 is a sectional view of the driver LSI. In a driver LSI 1, a source of a transistor (MOSFET) 2 is connected to a drain of a transistor (MOSFET) 3 in series, and a drain of the transistor 2 is connected to a battery voltage VB through a load 20. The transistor 2 and a semiconductor substrate in which the transistor 2 is formed are insulated from the other parts by a trench 4 and an embedded insulation layer 101. A gate of the transistor 3 is connected to an input terminal IN. A gate of the transistor 2 is connected to the input terminal IN through an isolator 5 transmitting signals or information, over a difference between an input and an output.

Further, a method of realizing the isolator 5 on a single chip is disclosed in JP A 11-136293, JP A 11-317445, etc. by the inventors. Further, the embedded insulation layer can be made by adhering a semiconductor substrate, on one side of which an insulation layer is formed, and another semiconductor substrate.

According to the present embodiment, since the transistor 2 and the transistor 3 connected to each other in series turn on/off at the same time according to signals applied on the input terminal IN, a function equivalent to one transistor having twice withstand voltage can be realized. Additionally, although usually, on-resistance is proportional to about the 2.5th power of withstand voltage, according to the present embodiment, the on-resistance proportional to the first power of the withstand voltage is sufficient and it is possible to reduce the whole on-resistance.

Further, in FIGS. 1, 2, an output port for only one channel is shown, however, it is matter-of-course that the driver LSI 1 can have output ports for plural channels. Additionally, as for the other embodiments explained hereunder, it also is a matter of course that the driver LSI 1 can have output ports for plural channels.

As shown in the sectional view of FIG. 2, the semiconductor substrates, in which the transistors 2 and the transistor 3 are formed, are insulated from each other by the insulation layer 101 and the trench 4 reaching the insulation layer. The semiconductor substrates are connected to source electrodes of the transistors, respectively and kept equal in voltage to the source electrodes. Thereby, the withstand voltage can be improved by connecting the transistors in series without being restricted by withstand voltage between the transistors and the semiconductor substrates.

Further, although the embodiment in which 2 transistors connected in series and the withstand voltage is increased twice has been explained on the above, in the similar manner, the withstand voltage can be increase N times by connecting N transistors in series, which fact is common to the following all embodiments.

Figure 3:
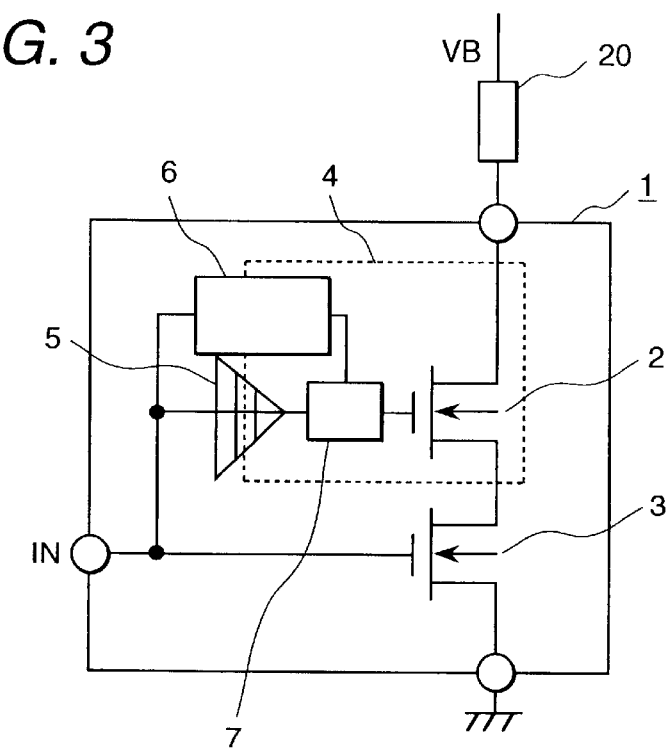
FIG. 3 is a diagram showing a second embodiment.

FIG. 3 shows a second embodiment. In the present embodiment, a charge pump 6 supplying power for operating an isolator 5 and a gate control circuit 7 is added.

Figure 4:
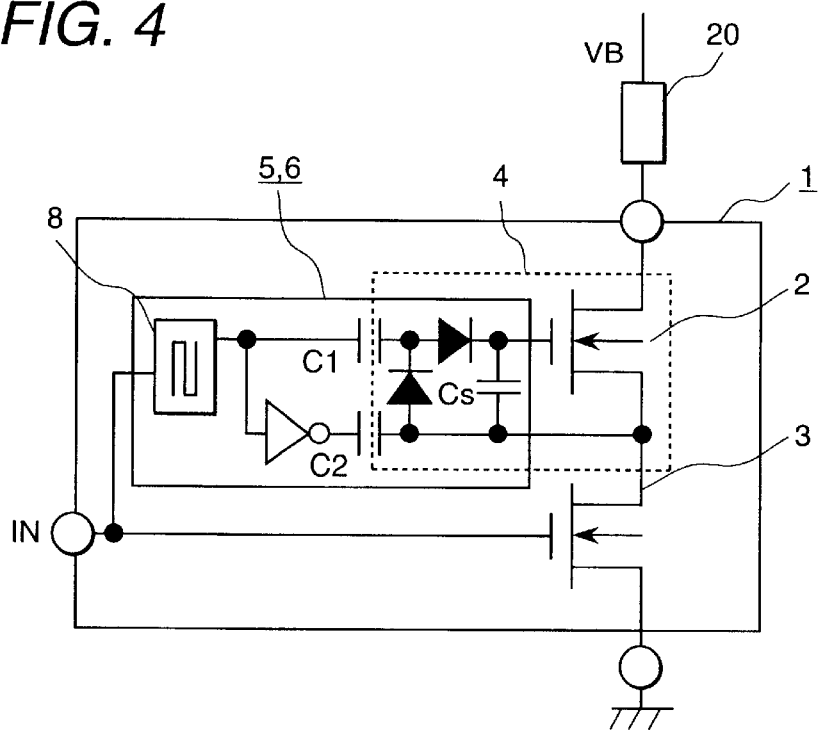
FIG. 4 is a diagram showing a third embodiment.

FIG. 4 shows a third embodiment. As shown in FIG. 4, an isolator 5 which is composed of a condenser C1 and a condenser C2 functions as a charge pump 6 and supplies the voltage boosted up to a condenser CS. That is, a differential output of an oscillator 8 is connected to a region of a transistor 2, which is isolated by a trench 4, through the condensers C1 and C2. An alternating current component transmitted through the condensers C1 and C2 is rectified by a voltage doubler rectifier circuit composed of two diodes in the region of the transistor 2 to be converted to DC voltage, and added to a gate of the transistor 2 to control the transistor 2.

Figure 5:
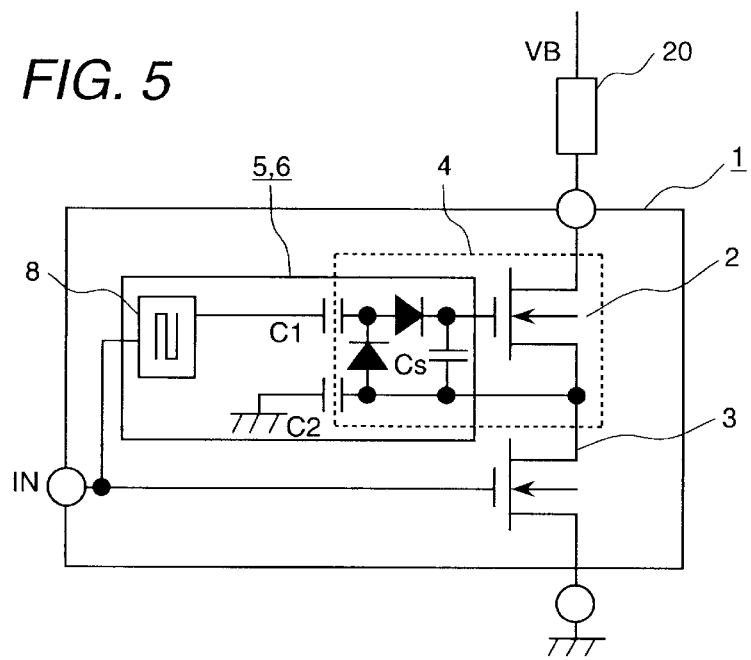
FIG. 5 is a diagram showing a fourth embodiment.

FIG. 5 shows a fourth embodiment. As shown in FIG. 5, the isolator composed of the condensers C1 and C2 operates by a single end. In the embodiments shown in FIGS. 4 and 5, the isolator 5 has a function of the charge pump 6 also, so that it is possible to reduce the scale of circuit.

Figure 6:
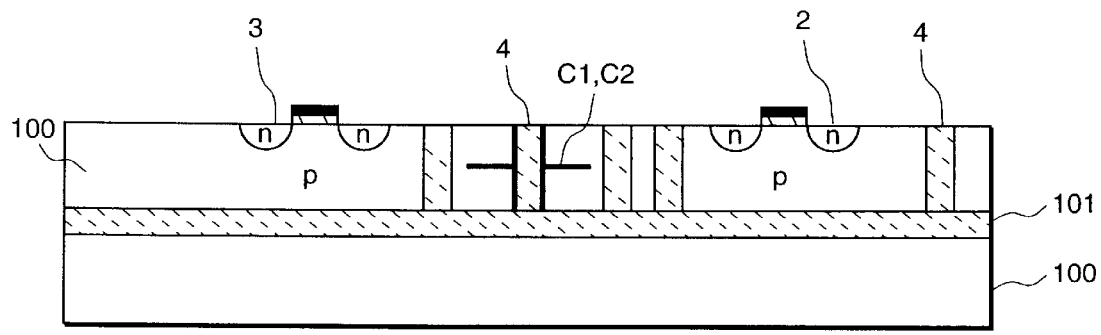
FIG. 6 is a view showing a method realizing condensers on a single chip.
Figure 7:
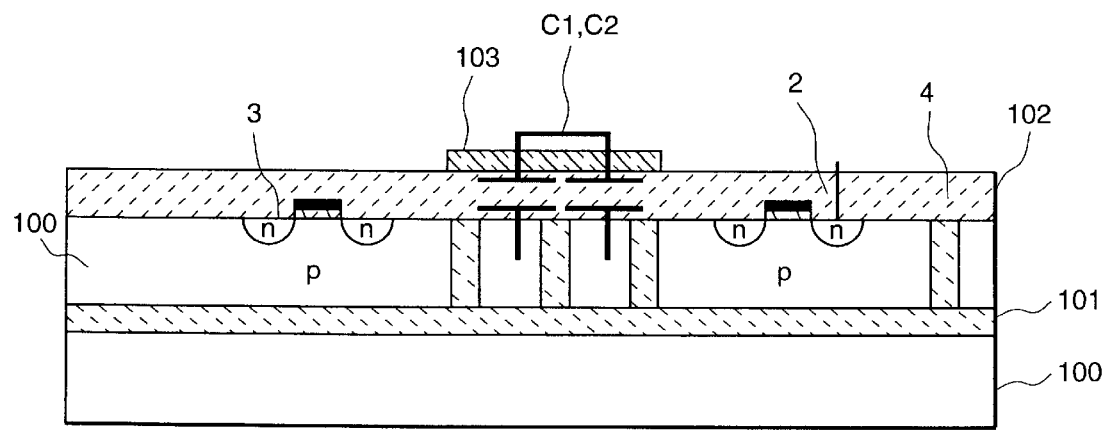
FIG. 7 is a view showing a method realizing condensers on a single chip.

Additionally, a method of realizing the condensers C1 and C2 on a single chip is disclosed in JP A 11-136293, JP A 11-317445, etc. by the inventors. FIG. 6 shows a method of realizing the condensers C1 and C2 using a capacitance between trenches 4, proposed by the above-mentioned JP A 11-136293. Further, FIG. 7 shows a method of realizing the condensers C1 and C2, using an interphase insulation layer 102 proposed by the above-mentioned JP A 11-136293. The details of those methods are disclosed in the above-mentioned publications. Further, it is a matter of course to be able to form the condensers C1 and C2 not on a single chip but on another part attached outside.

Figure 8:
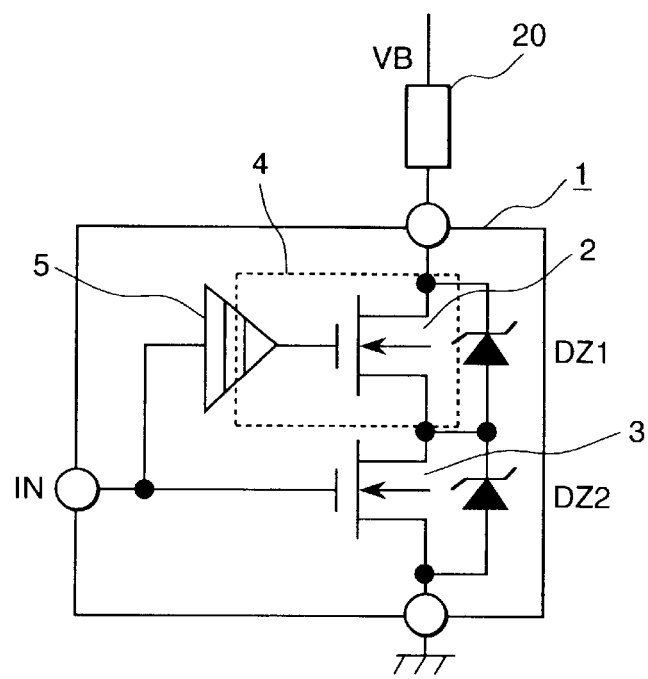
FIG. 8 is a diagram showing a fifth embodiment.

FIG. 8 shows a fifth embodiment. As shown in FIG. 8, zener diodes DZ1, DZ2 for clump are added to the transistors 2 and 3 constructing the driver LSI. In the case of an inductive load, in many cases, the zener diodes for clump are added for protection in order to prevent the elements from being broken by the voltage more than break down voltage, applied by the counter electromotive force. In the present embodiment, the zener diodes DZ 1 and DZ2 are added to the drain and the source of each of the transistors 2 and 3 in parallel. According to the present embodiment, in the case where imbalance occurs on shearing voltage of the transistors 2 and 3, the zener diode which is higher in shearing voltage is turned on first, whereby the shearing voltage is balanced. In this manner, according to the present embodiment, the transistors 2 and 3 connected in series are not only protected from surging and the counter electromotive force but also causes their sharing voltage to be balanced, whereby the withstand voltage of the transistors 2, 3 can be used at maximum.

Figure 9:
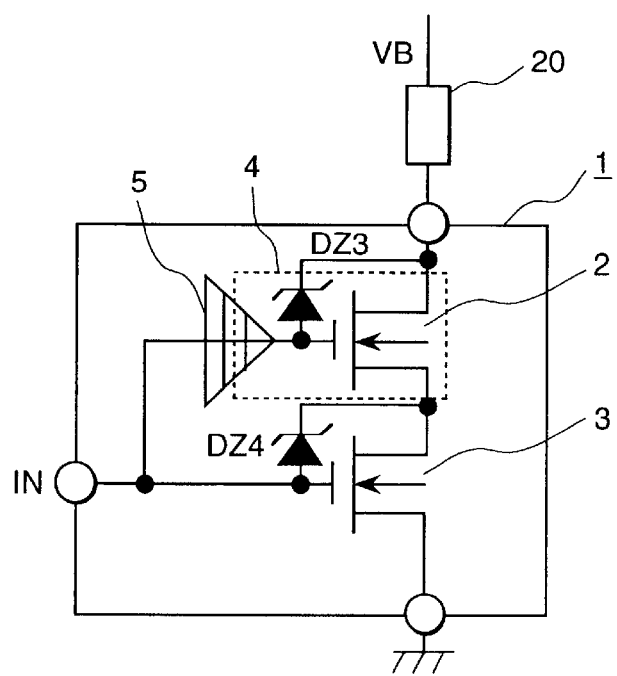
FIG. 9 is a diagram showing a sixth embodiment.

FIG. 9 shows a sixth embodiment. In the same manner as in FIG. 8, zener diodes DZ3, DZ4 are added. In the present invention, the zener diodes DZ3, DZ4 are added between the drain and the gate of each transistor 2, 3. According to the present embodiment, in the case where imbalance occurs in the shearing voltage of the transistors 2, 3, the voltage between the drain and the gate on the side on which the shearing voltage is higher becomes higher, the zener diode turns on earlier and the voltage applied on the gate is made higher, the on-resistance is lowered and the shearing voltage is lowered, as a result, the shearing voltage is balanced. In this manner, according to the present embodiment, the transistors 2, 3 are not only protected from surging and counter electromotive force, but also cause their shearing voltage to be balanced, whereby the withstand voltage can be used at maximum. Further, according to the present embodiment, since only slight current flows in the zener diodes DZ3, DZ4, it is sufficient for them to be of small capacitance, so that the chip area can be smaller by an area corresponding to the reduced capacitance than in the embodiment in FIG. 8. However, energy at time of voltage clumping is necessary to be absorbed at the transistors 2, 3, so that in the case where frequency of voltage clamp is many, it is necessary to design the transistors 2, 3 so as to be little larger so that the energy can be absorbed.

Figure 10:
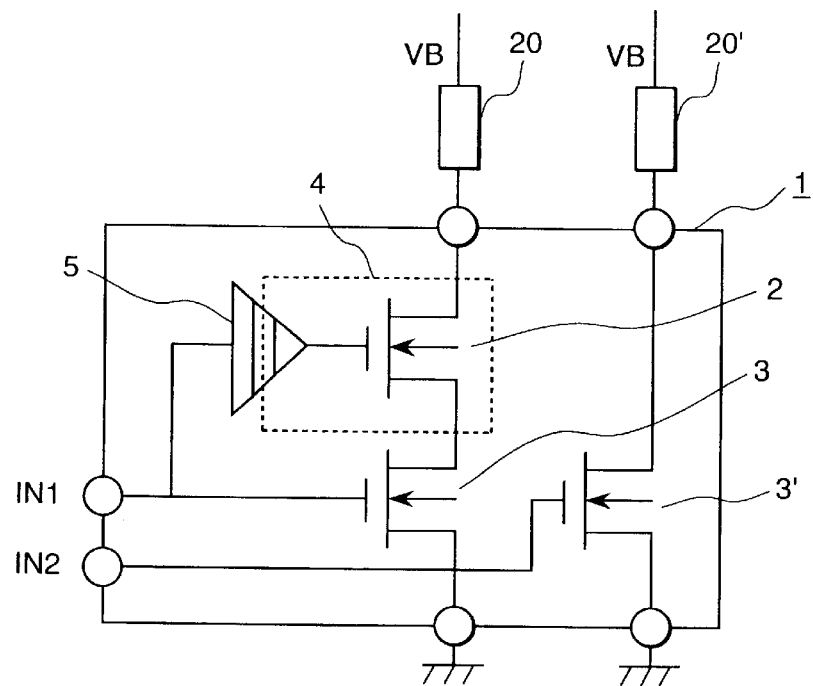
FIG. 10 is a diagram showing a seventh embodiment.

FIG. 10 shows a seventh embodiment. As shown in FIG. 10, a driver having a high withstand voltage and a driver having a low withstand voltage are mixed inside a driver LSI formed of a single chip. The driver of a high withstand voltage is composed of a transistor 2 and a transistor 3, and the source of the transistor 2 and the drain of the transistor 3 are connected each other in series and connected to a battery voltage VB through a load 20. The gate of the transistor 3 is connected to an input terminal IN1, the gate of the transistor 2 is connected to the input terminal IN1 through an isolator 5 transmitting signals or information, over difference between input and output. The driver of a low withstand voltage is composed of only a transistor 3'. Here, a semiconductor substrate on which the transistors 2 and 3 are formed is insulated from the other parts by a trench 4. That is, the transistor 2 is insulated from the transistors 3 and 3' by the trench 4. In this case, it is always not necessary to insulate between the transistor 3 and the transistor 3' by the trench 4.

Figure 11:
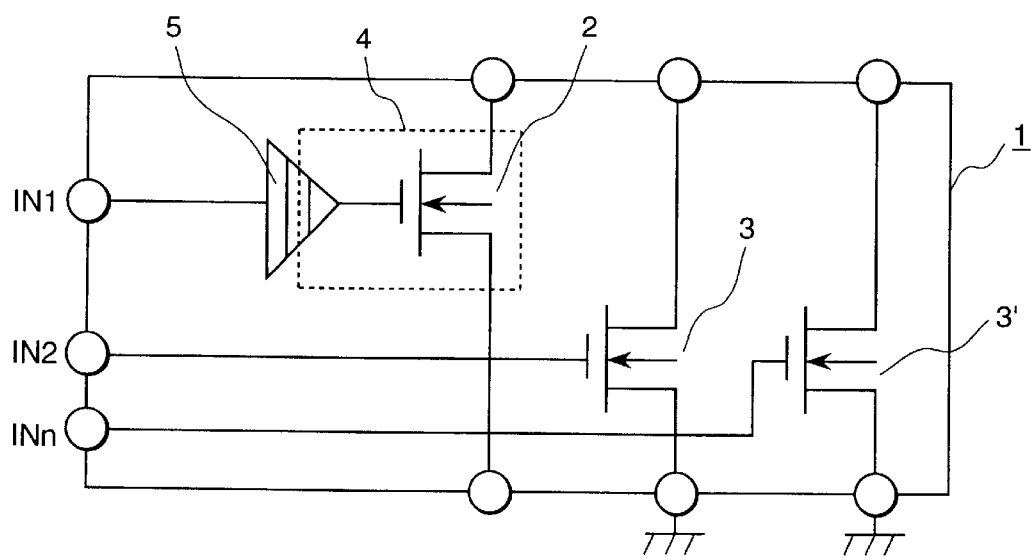
FIG. 11 is a diagram showing an eighth embodiment.

FIG. 11 shows an eighth embodiment. As shown in FIG. 11, each of drain and source terminals of a transistor 2 is isolated from the other parts by a trench 4, and drain and source terminals of the transistors 3 and 3' using commonly a semiconductor substrate without being isolated by the trench 4 is led out as external terminals of the driver LSI, whereby common use of the circuit is established.

Figure 12:
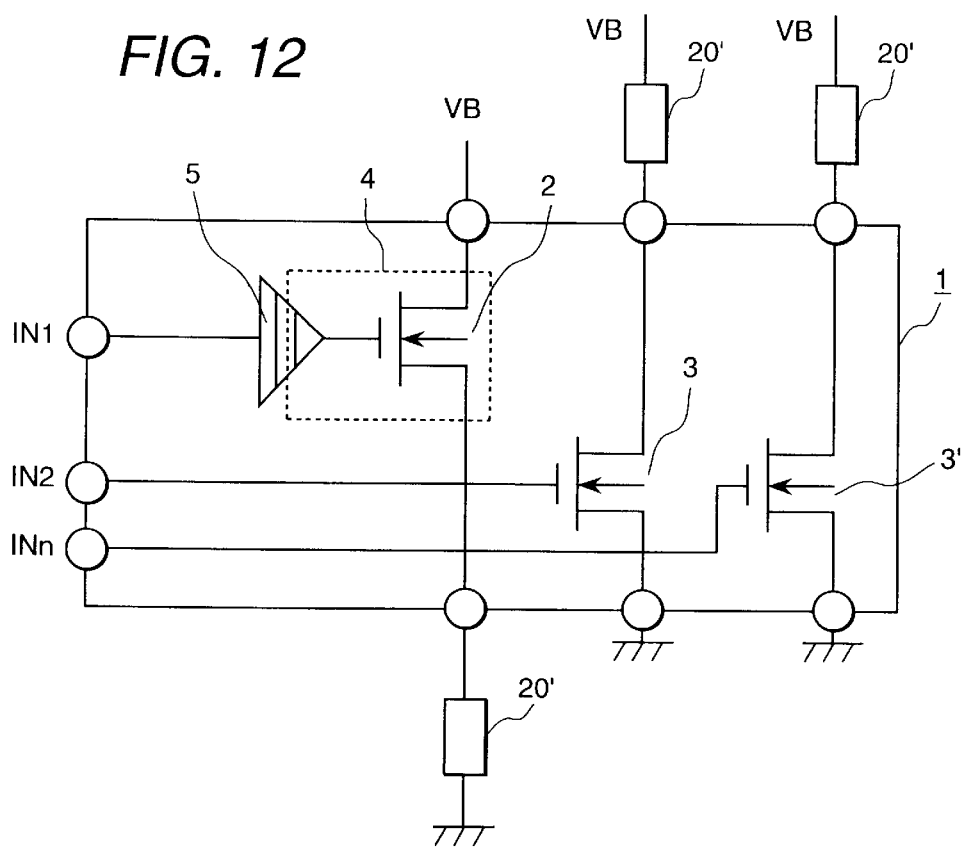
FIG. 12 is a diagram showing a use example of an apparatus of the eighth embodiment.

FIG. 12 shows an example in which the transistor 2 and the transistors 3 and 3' inside the driver LSI 1 shown in FIG. 11 are used as a high side driver (high voltage side drive) and low side drivers (low voltage side drive), respectively.

Figure 13:
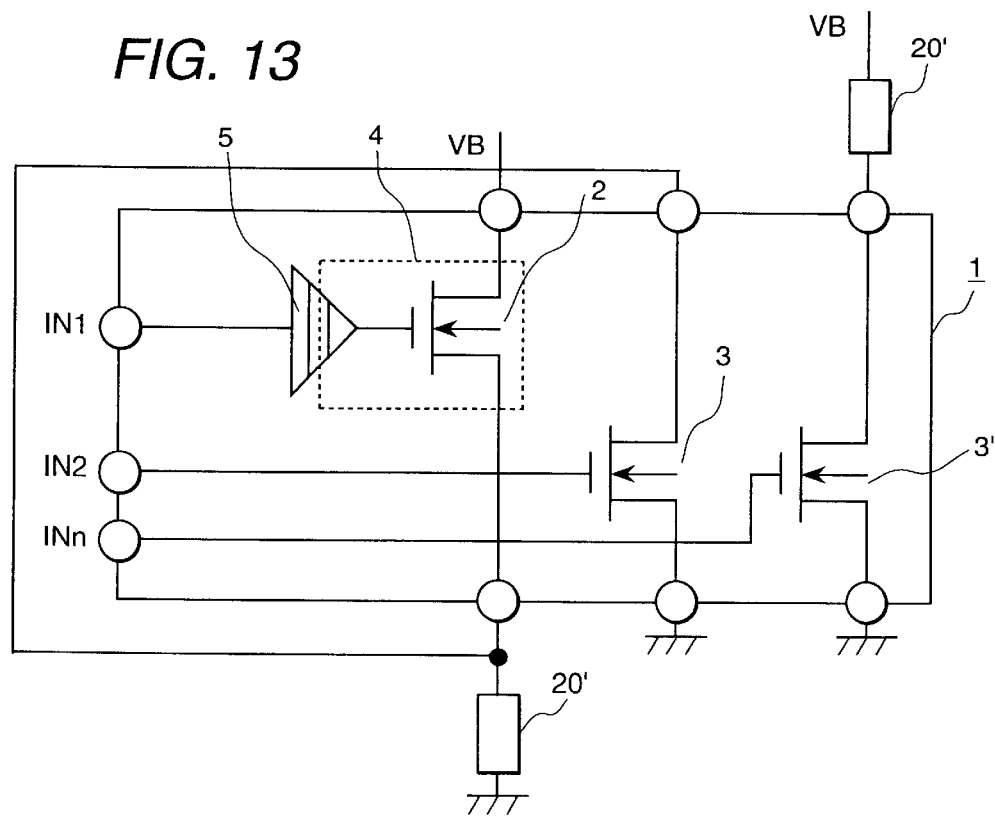
FIG. 13 is a diagram showing another use example of the apparatus of the eighth embodiment.

FIG. 13 show an example in which the transistors 2 and 3 inside the driver LSI shown in FIG. 11 are used as a half bridge, and the transistor 3' is used as a low side driver. Further, the half bridge can form a full bridge (H bridge) by combining it with another half bridge.

Figure 14:
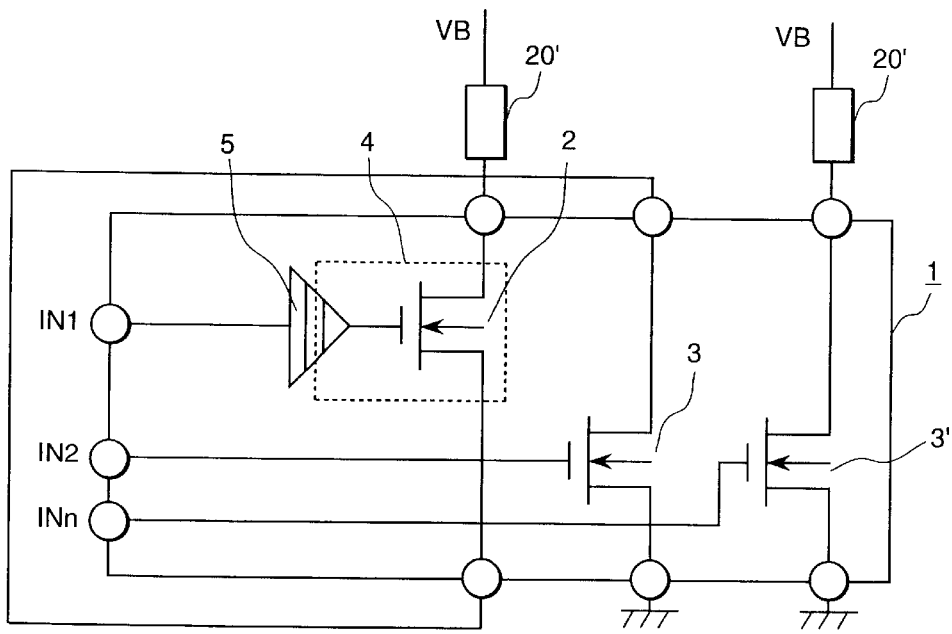
FIG. 14 is a diagram showing further another use example of the apparatus of the eighth embodiment.

FIG. 14 shows an example in which the transistors 2 and 3 inside the driver LSI shown in FIG. 11 are used as the high withstand driver shown in FIG. 1, and the transistor 3' is used as a low side driver.

As mentioned above, by using the driver LSI having the common use property as shown in FIG. 11, it is possible to form various types of drivers as shown in FIG. 12 to FIG. 14. Further, by connecting in series the transistors of necessary stages according to withstand voltage, it is possible to realize a driver of the minimum on-resistance coping with the withstand voltage. Further, in a lateral type transistor, since a distance between the drain and the source can be made minimum according to the withstand voltage, the chip area can be minimized.

Further, it is necessary for the gates of transistors forming those compounded drivers to be controlled, linking with each other. For example, in the case where it is used as a high withstand driver as shown in FIG. 14, it is necessary to turn the transistors 2 and 3 on or off at the same time. Further, in the half bridge shown in FIG. 13, it is necessary to simultaneously turn on or off the transistors 2 and 3 to prevent short circuit between the power supply and the earth. However, for the other usages than this, it is possible to take various gate driving combinations. Those linking patterns can be controlled more surely and fast when realized by logic circuits.

Figure 15:
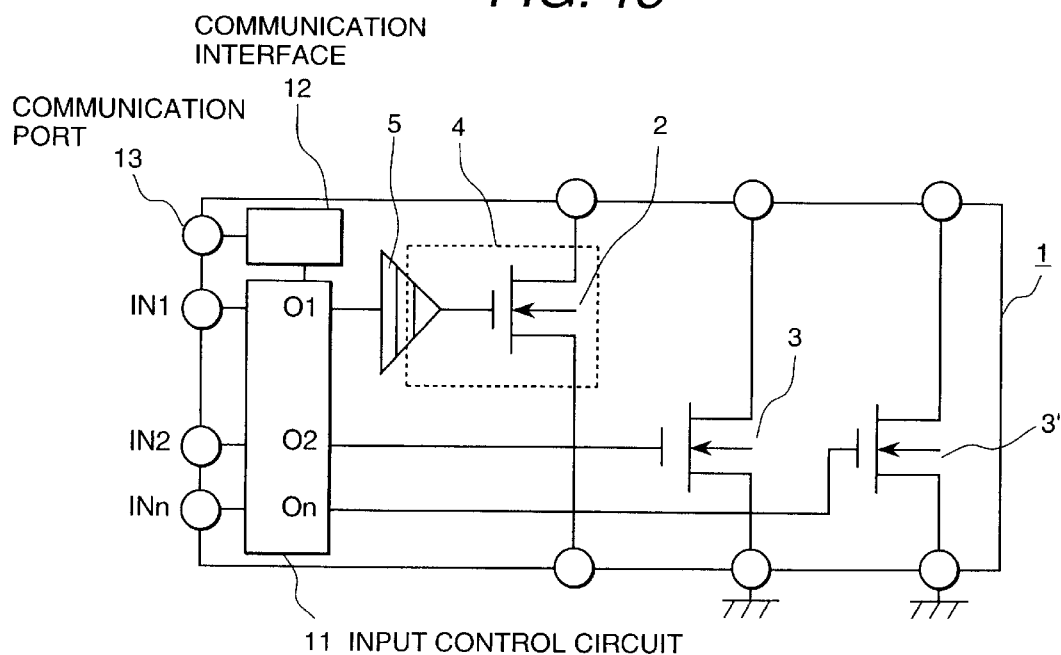
FIG. 15 is a diagram showing a ninth embodiment.

FIG. 15 shows a ninth embodiment. Since each gate of the transistors is controlled in linkage as mentioned above, the input control circuit 11 is contained inside the driver LSI. In the present embodiment, the driver LSI 1 is provided with an communication interface 12. The input control circuit 11 sets a pattern controlling each gate of the transistors in linkage on the basis of input signals inputted through a communication port 13.

The input control circuit 11 outputs control patterns O1-On of the transistors according to the linked patterns. Thereby, the linked control for various constructions as shown in FIGS. 12 to 14 can be realized by the input control circuit 11.

Figures 16, 17, 18:
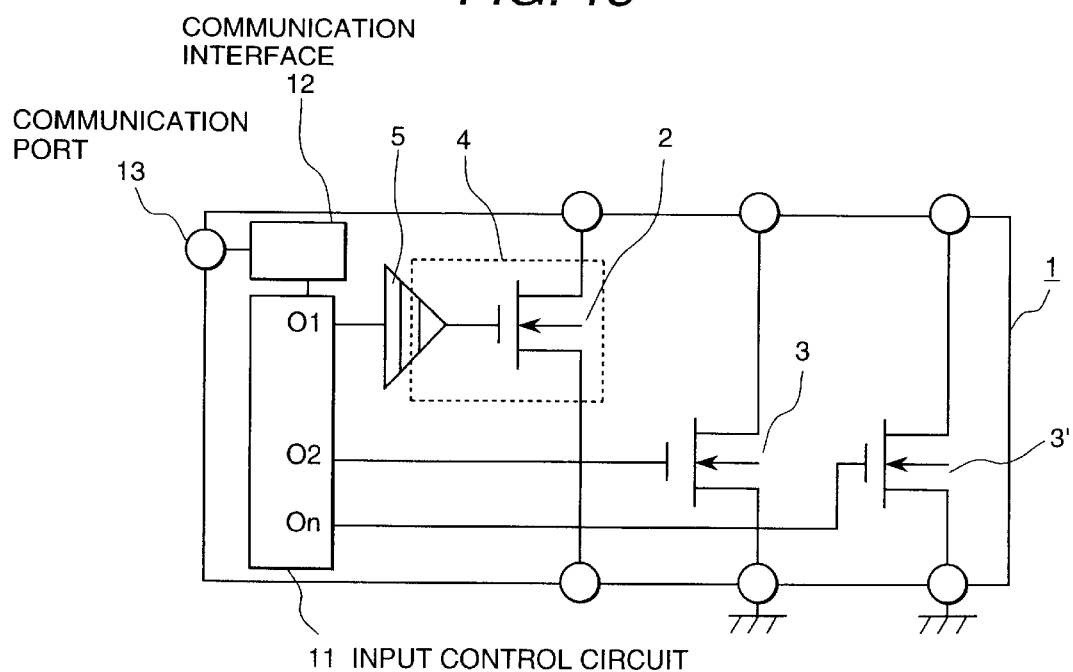
FIG. 16 is a table showing an example of a logic of input control circuit for half bridge.
FIG. 17 is a table showing an example of a logic of input control circuit for high withstand voltage driver.
FIG. 18 is a diagram showing an example in which input signals of an input terminal are omitted.

FIG. 16 shows an example of the logic of the input control circuit 11 for the half bridge shown in FIG. 13. In this logic table, it is made so that output for turning on the transistors 2 and 3 at the same time in order to prevent short circuit between the power supply and the ground is not outputted. Further, FIG. 17 shows an example of the logic of the input circuit 11 for high withstand driver shown in FIG. 14. Signals for turning on/of the transistors 2 and 3 are outputted at the same time according to input signals IN1. Further, FIG. 18 shows an example in which input signals of input terminals IN1 to 1Nn are omitted. As shown in FIG. 18, the input terminals IN1 to INn become unnecessary by inputting information corresponding to the input signals of the input terminals IN1 to INn.

Figure 19:
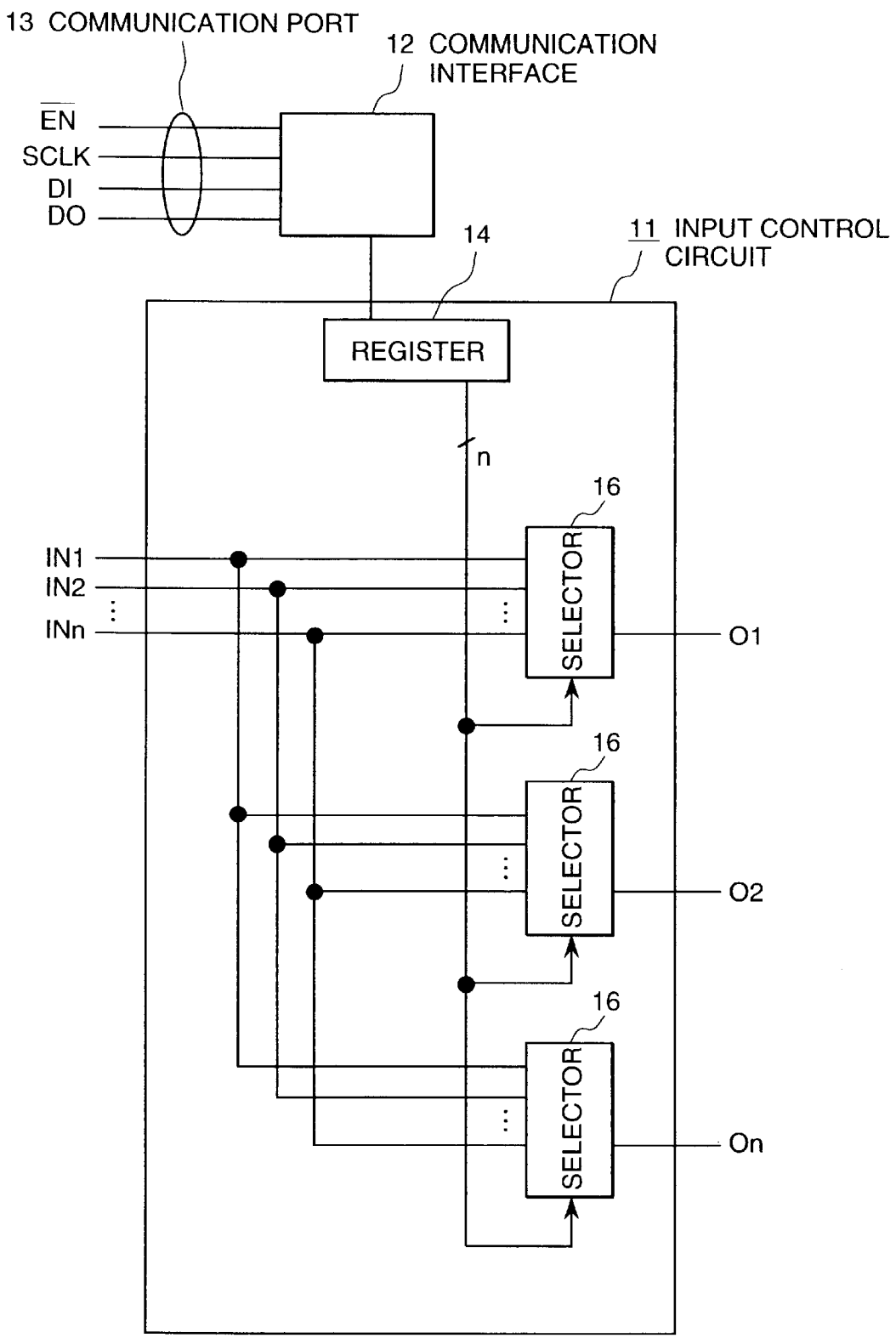
FIG. 19 is a block diagram showing an example of an input control circuit.

FIG. 19 shows an example of the input control circuit 11 for FIG. 15. Information sent from the communication port 13 is written into a register 14 by a communication interface 12. Each selector 16, which is arranged corresponding to each output O1 to On of the input control circuit 11, selects one of the input terminals IN1 to INn on the basis of signals from the resistor 14, and an input from the elected input terminal becomes made an output O1 to On of each selector. Further, a meaning of each signal of the communication port 13 is as follows:

EN: Enable, SCLK: Shift Clock, DI: Data In, DO: Data Out.

Figure 20:
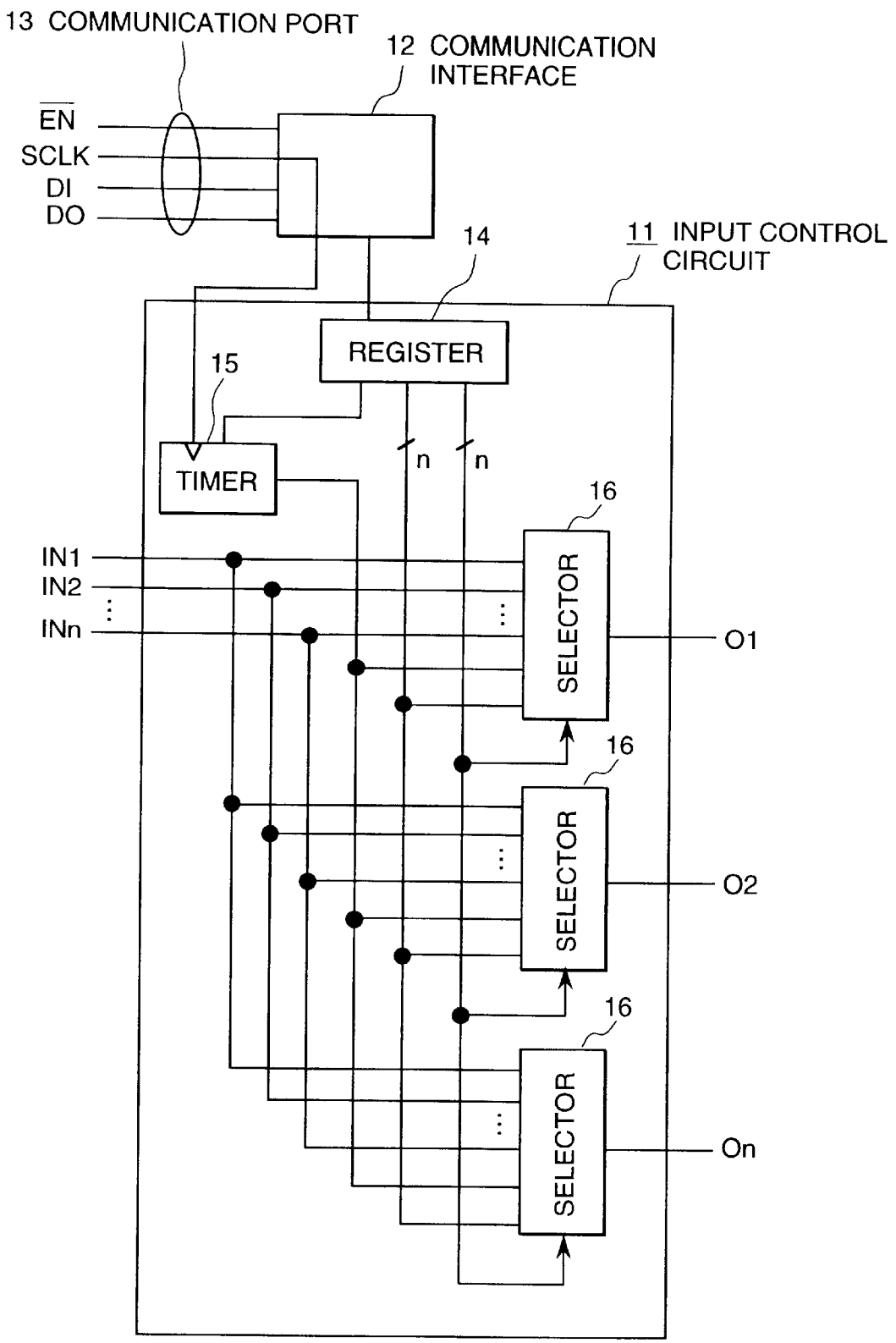
FIG. 20 is a block diagram showing an example of an input control circuit having a timer.

FIG. 20 shows an example of an input control circuit 11 having a timer. Information sent from a communication port 13 is written into a register 14 by a communication interface 12. Each selector 16, which is arranged corresponding to each output O1 to On of the input control circuit 11, selects one from outputs of input terminals IN1 to INn and a timer 15 on the basis of signals from the resistor 14, and a selected signal becomes an output O1 to On of each selector. The timer 15 is controlled by the information written in the resistor 14, and operates as a standard clock which is SCLK (Shift Clock). As the operation of the timer 15, various modes can be taken. First, an operation can be considered which repeats on/off by duty corresponding to the information written in the resistor 14. By operating the timer 15 in this mode, it is possible to control an output of the driver LSI1 by PWM (pulse width modulation). Next, an operation mode can be considered which turns on/off output after lapse of a time corresponding to the information written in the resistor 14. By operating the timer 15 in this mode, it is possible to perform on/off-control of outputs of the driver LSI1 at precise time.

Figure 21:
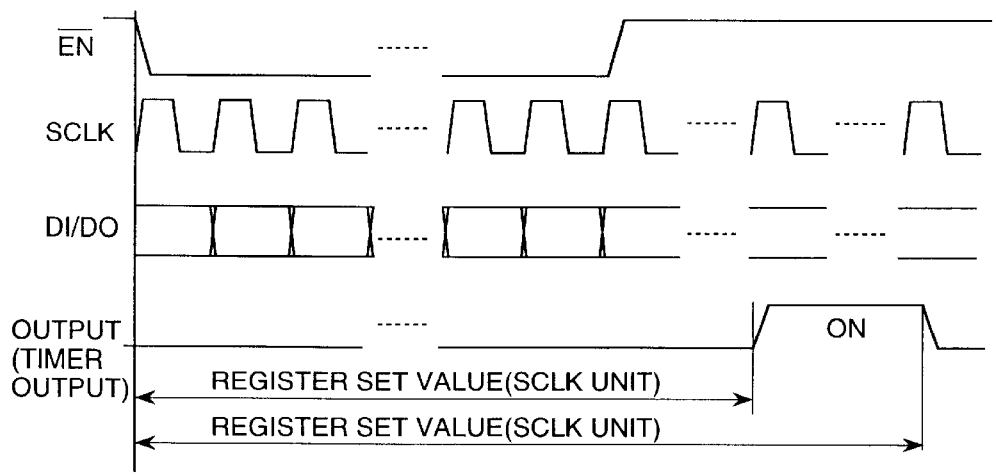
FIG. 21 is a graph for explanation of an operation example of the timer.
Figure 22:
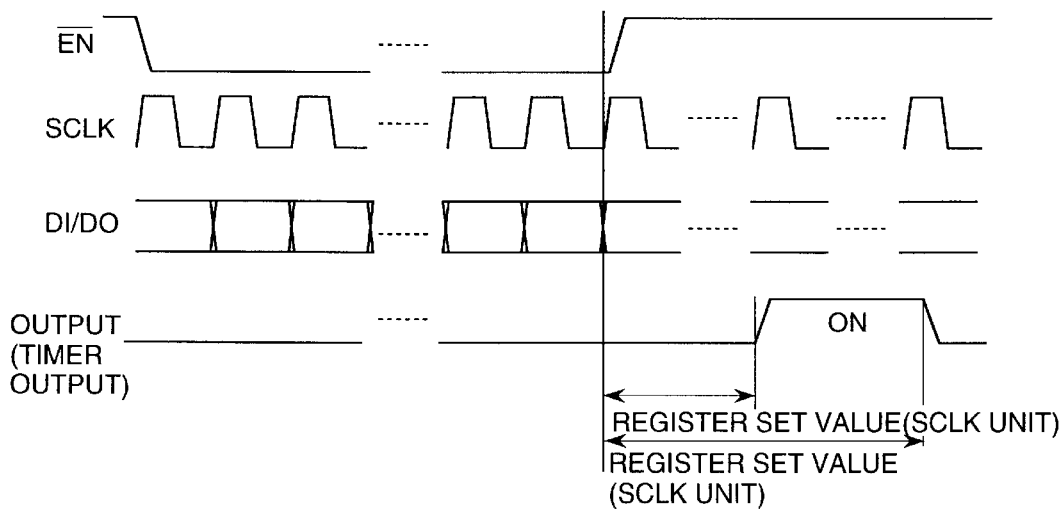
FIG. 22 is a graph for explanation of another operation example of the timer.
Figure 23:
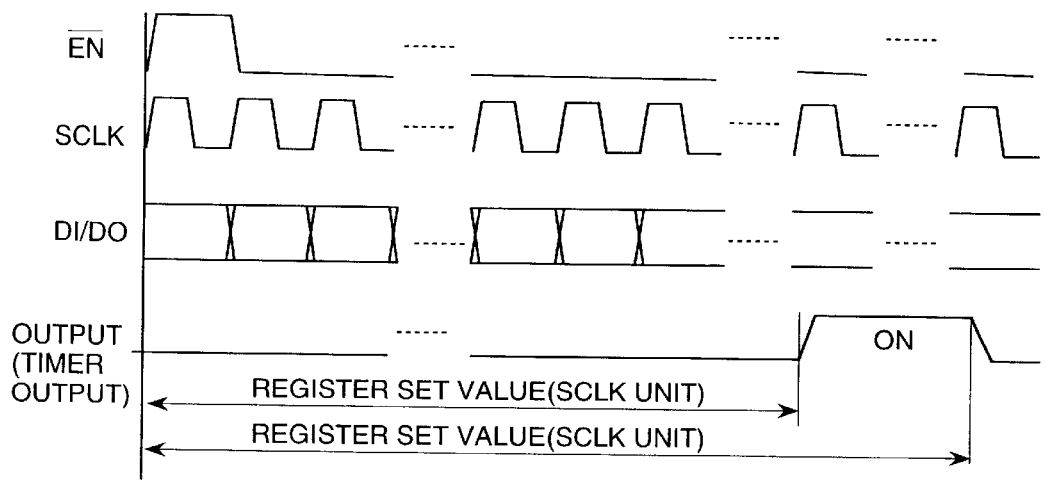
FIG. 23 is a graph for explanation of a further another operation example of the timer.

FIGS. 21 to 23 are diagrams for explaining operations of the input control circuit shown in FIG. 20. In order to operate the timer 15 in the above-mentioned operation mode of turning on/off the output after lapse of time corresponding to the information written in the resistor 14, base time information of time lapse is necessary.

FIG. 21 shows an example in which rise-down of a signal EN is taken as base time, and timer output is turned on after lapse of time corresponding to the information set in the resistor 14 as a base of SCLK. FIG. 22 shows an example in which first rise-up of a signal EN is taken as base time, and timer output is turned on after lapse of time corresponding to the information set in the resistor 14 as a base of SCLK. Further, FIG. 23 shows an example in which rise-up of a signal FS (Frame Synchronization) is taken as standard time, and the output is turned on after lapse of time corresponding to the information set in the resistor 14 as a standard of SCLK.

By transmitting control signals to the communication through a network as mentioned above, it is possible to effect on/off control of output of the driver LSI with high time precision, it becomes unnecessary to employ any control signal line for each output which has been necessary to effect real time control, and it is possible to effect less wiring by utilizing the characteristics of the network, reduce the number of pins and make the size of package small.

Figure 24:
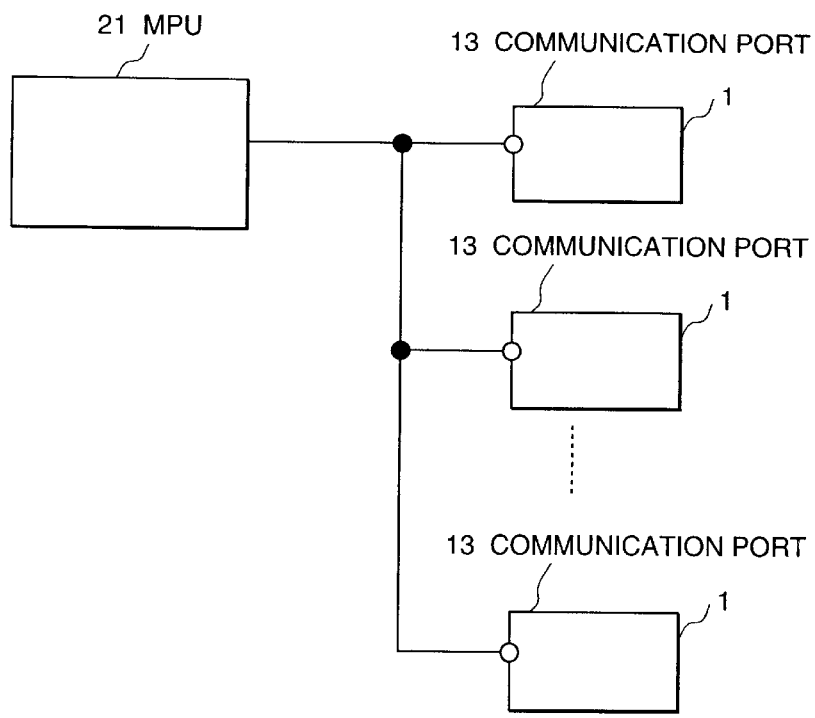
FIG. 24 is a block diagram for explanation of a transmission system of control information.

FIG. 24 is a diagram for explaining a transmission system of control information. In a controller for controlling a driver, a microprocessor controls the whole in many cases, so that transmission of control information to each input control circuit from the microprocessor 21 through the communication port 13 can contribute greatly to reduction in wiring of the controller.

Figure 25:
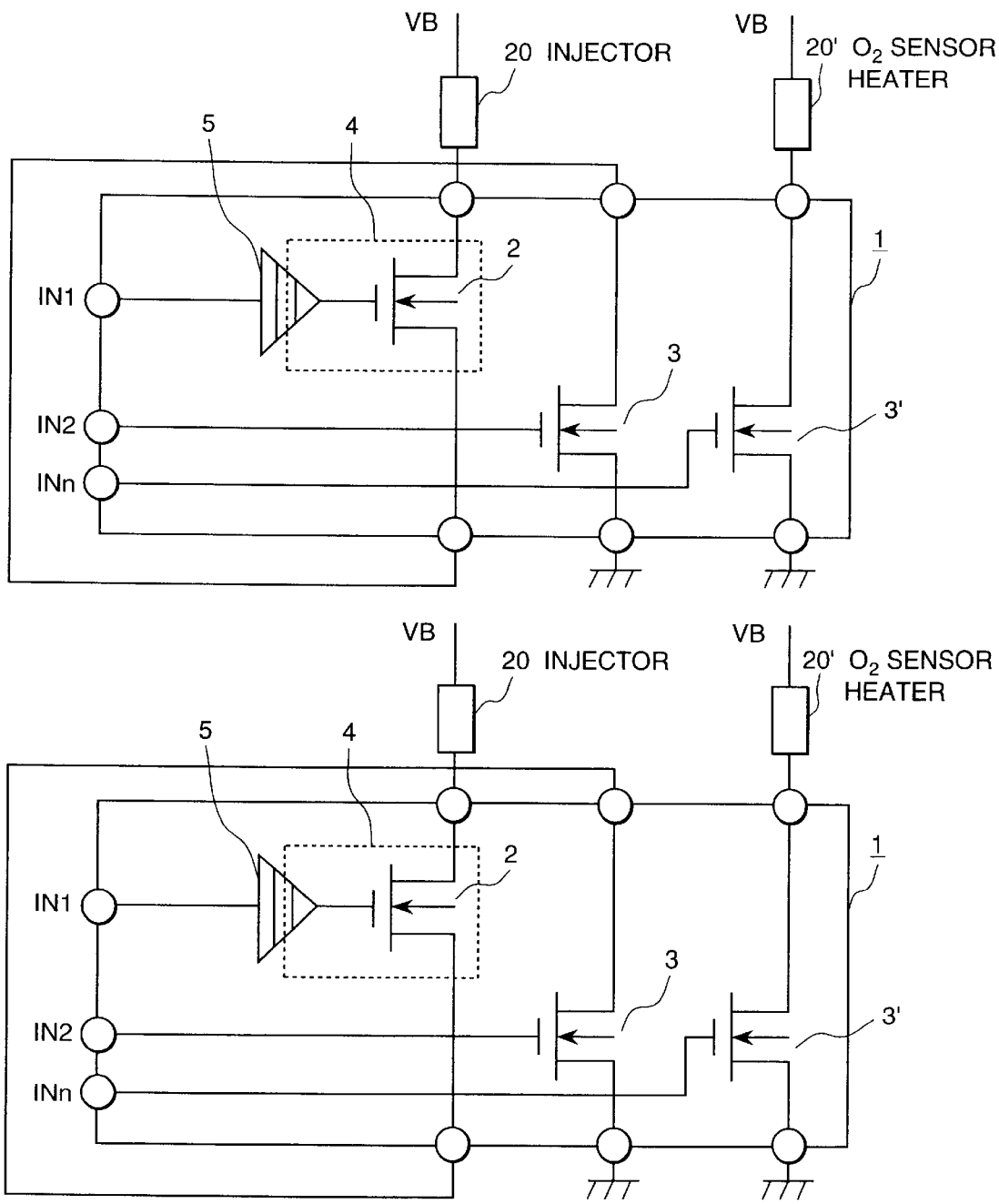
FIG. 25 is a diagram showing a tenth embodiment.

FIG. 25 shows circuits of a tenth embodiment. It is an example in which the driver LSI1 of FIG. 11 is used in an engine controller of an injector, etc. A load that counter electromotive force is large, such as an injector, is connected, as a load 20, to the high withstand voltage driver that the transistors 2 and 3 are connected in series. Generally, withstand voltage of about 60V to 100V is required for an injector. Further, in the case where an ignition coil is used as a load, since withstand voltage of several hundreds voltage V is required for the ignition coil, it is necessary to connect transistors (MOSFET) in series in multistage. For example, when withstand voltage of a single transistor (MOSFET) is 40V to 60V, the withstand voltage of a high withstand voltage driver that is formed by connecting two such transistors in series in multistage becomes about 80 V to 120V which is twice as high as that of the single transistor, and it is possible to secure the withstand voltage required for the injector driver.

Figure 26:
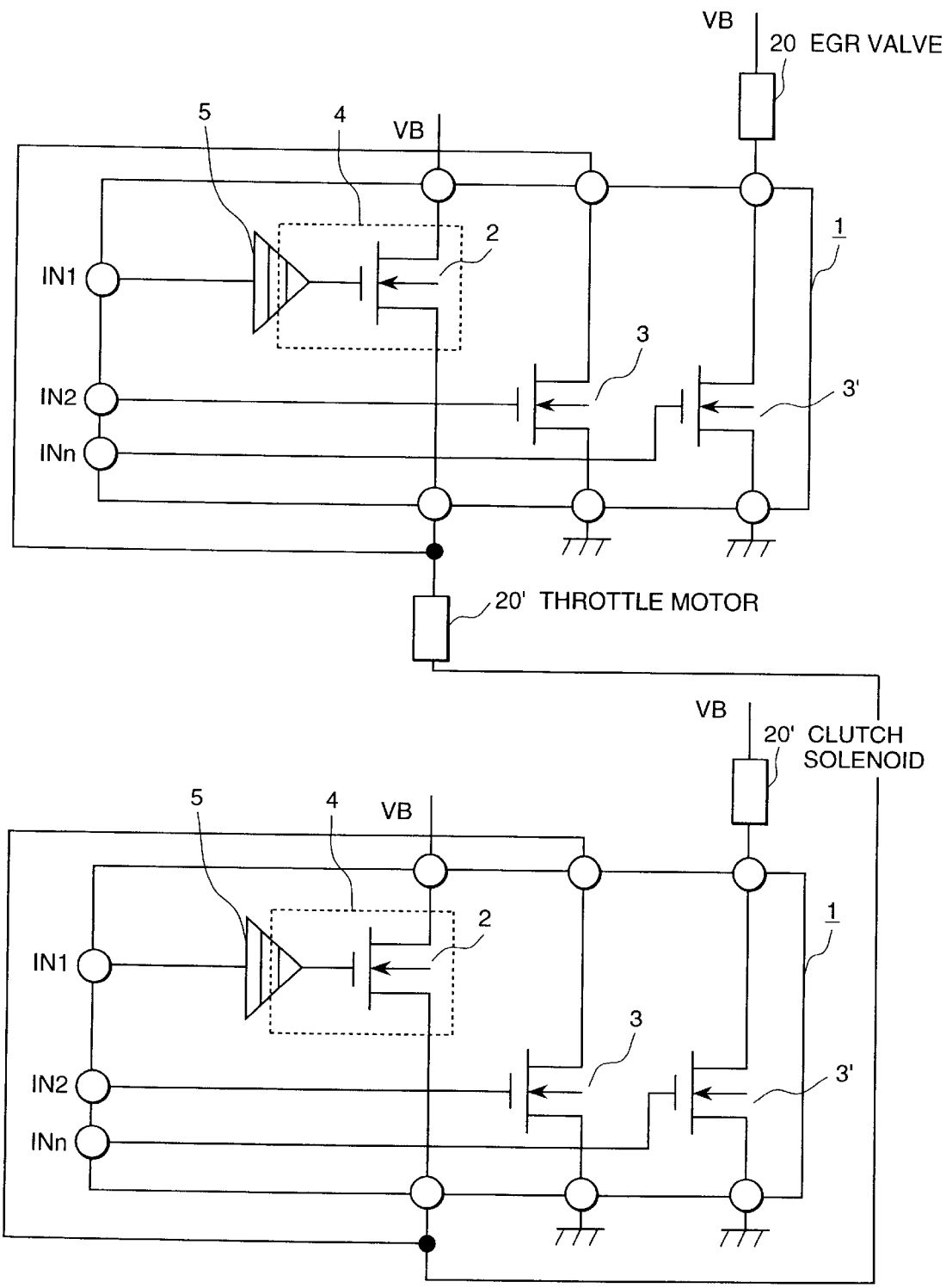
FIG. 26 is a diagram showing an eleventh embodiment.

FIG. 26 shows an eleventh embodiment and is a diagram of an example in which the driver LSI1 in FIG. 11 is used for an engine controller of a throttle motor, etc. The throttle motor is connected, as a load 20', to a full bridge formed by combining two half bridges each comprising the transistors 2 and 3. Further, a heater for $O_2$ sensor, an EGR (exhaust gas recirculation flow) valve, a clutch solenoid, etc. is connected, as a load 20', to a low side driver composed of a single transistor 3'. The withstand voltage of the drivers of those usual loads is sufficient if it is a withstand voltage of a single transistor.

As mentioned above, according to the present embodiment, it is possible to mix and dispose drivers of different withstand voltage on the same chip, in addition, it is possible to use the same kind of LSI as drivers of various loads, so that it is possible to reduce a development cost and a product cost by a mass production effect.

FIGS. 27, 28 and 29 are for explanation of examples of specification of driver LSI suitable for engine controllers and methods of using them.

Generally, a vehicle engine has 4 cylinders, 6 cylinders or 8 cylinders in many cases. So, by using each channel (a transistor switch constructing a driver) as shown in FIGS. 27 to 29, corresponding to those numbers of cylinders, each engine controller can be made by drivers LSI of the same specification.

In FIG. 27, each channel 1a, 1b, 2a, 2b, 3a, 3b, 4a, 4b, 5a, 5b, 6a, 6b has withstand voltage of 40V in single. The channel 1a, 2a, 3a, 4a, 5a, 6a is realized by a transistor 2 insulated by a trench 4 as in the embodiment shown in FIG. 1. A channel 7 to n is composed of an un-insulated transistor (MOSFET) as the transistor 3' shown in FIG. 10.

In the case where it is used for control of a 4 cylinder engine, only one LSI is used, the channels 1a, 1b, 2a, 2b, 3a, 3b, 4a, 4b are used as injector drivers, the channels 5a, 5b, 6a, 6b and the channels 7 to n are used as drivers of a low voltage load other than a usual solenoid, a heater, a rely, etc. The channels 1a and 1b, 2a and 2b, 3a and 3b and 4a and 4b, each are connected in series to obtain the withstand voltage (80V) which is needed as injector drivers. Here, when the on-resistance of a single channel having withstand voltage of 40V is made 0.3 ohm, the on-resistance of channels which are connected in series to have withstand voltage (80V) which is needed as an injector driver becomes 0.6 ohm. Further, the channels 5a, 5b, 6a, 6b can be used as a full bridge for driving a throttle motor as shown in FIG. 26.

Next, in the case where it is used for control of a 6 cylinder engine, only one LSI is used, the channels 1a, 1b, 2a, 2b, 3a, 3b, 4a, 4b, 5a, 5b, 6a, 6b are used as an injector driver, and the channel 7 to n are used as drivers of low voltage loads other than a usual solenoid, heater, relay, etc. Further, the channels 1a and 1b, 2a and 2b, 3a and 3b, 4a and 4b, 5a and 5b and 6a and 6b are connected in series to obtain the withstand voltage which is needed as injector drivers.

Finally, in the case where it is used for control of an 8 cylinder engine, only two LSI are used, the channels 1a, 1b, 2a, 2b, 3a, 3b, 4a, 4b of each LSI are used as an injector driver, and the channels 5a, 5b, 6a, 6b and channels 7 to n are used as drivers of a low voltage loads other than a usual solenoid, a heater, a relay, etc. The channels 1a and 1b, 2a and 2b, 3a and 3b and 4a and 4b each are connected in series to obtain the withstand voltage which is needed as injector drivers. Further, the channels 5a, 5b, 6a, 6b can be used as a full bridge for driving a throttle motor as shown in FIG. 26.

In FIG. 28, channels 1 to 4 each have withstand voltage of 80V. As methods of realizing the channels 1 to 4, there are a method of connecting in series the transistors 2 and 3 insulated by the trench 4 as in the embodiment in FIG. 1, a method of making a horizontal distance between a drain and a source in a horizontal type transistor (MOSFET), etc., and any method can be taken. The channels 5a, 5b, 6a, 6b each have 40 V independently. The channels 5a, 6a are realized by the transistor 2 insulated by the trench 4 as in the embodiment in FIG. 1. The channels 7-n each are constructed from a transistor(MOSFET) which is not insulated as in the transistor 3' in FIG. 10.

In the case where it is used for control of a 4 cylinder engine, a single LSI is used, the channels 1 to 4 are used as injector driver, the channels 5a, 5b, 6a, 6b and the channels 7 to n are used as drivers of a low voltage load other than a usual solenoid, a heater, a relay, etc. Further, the channels 5a, 5b, 6a, 6b can be used as a full bridge for driving a throttle motor as in FIG. 26.

Next, in the case where it is used for control of a 6 cylinder engine, a single LSI is used, the channels 1 to 4 and channels 5a, 5b, 6a, 6b are used as injector drivers, and the channels 7 to n are used as drivers of a low voltage load other than a usual solenoid, a heater, a relay, etc. Further, the channels 5a and 5b, 6a and 6b each are connected to each other in series to have the withstand voltage needed as injector drivers.

Finally, in the case where it is used for control of an 8 cylinder engine, two LSI are used, the channels 1 to 4 of each LSI are used as injector drivers, the channels 5a, 5b, 6a, 6b and the channels 7 to n are used as drivers of a low voltage load other than a usual solenoid, a heater, a relay, etc. Further, the channels 5a, 5b, 6a, 6b can be used as a full bridge for driving a throttle motor as in FIG. 26.

As mentioned above, according to the present embodiment, drivers of different withstand voltage are mixed and disposed on the same chip, in addition the same kind of LSI can be effectually used commonly to control for a 4 cylinder engine, 6 cylinder engine or 8 cylinder engine, so that it is possible to reduce a development cost and a production cost by a mass production effect. Further, in the case where one channel of injector driver of a high withstand voltage is used as a low withstand voltage driver, it can be used for two channels, in addition, the on-resistance can be reduced to ½.

In FIG. 29, channels 1 to 4 each have withstand voltage of 400V. As methods of realizing the channels 1 to 4, there are a method of connecting in series transistors (MODFET) insulated by a trench 4 as in the embodiment in FIG. 1, a method of making large a horizontal distance between a drain and a source in a horizontal type transistor (MOSFET), etc., and any method can be taken. The channels 5a to 5j, 6a to 6j each have 40 V individually. The channels 5a to 5j, 6a to 6j are realized by the transistor 2 insulated by the trench 4 as in the embodiment in FIG. 1. The channels 7-n each are constructed from a transistor(MOSFET) which is not insulated as in the transistor 3' in FIG. 10.

In the case where it is used for control of a 4 cylinder engine, a single LSI is used, the channels 1 to 4 are used as igniter drivers, the channels 5a to 5j, 6a to 6j and the channels 7 to n are used as drivers of a low voltage load other than a usual solenoid, a heater, a relay, etc. Further, the channels 5a to 5j, 6a to 6j can be used as a full bridge for driving a throttle motor as in FIG. 26. Next, in the case where it is used for control of a 6 cylinder engine, a single LSI is used, the channels 1 to 4 and channels 5a to 5j, 6a to 6j are used as igniter drivers, and the channels 7 to n are used as drivers of a low voltage load other than a usual solenoid, a heater, a relay, etc. Further, the channels 5a to 5j, 6a to 6j each are connected to each other in series to have the withstand voltage needed as igniter drivers.

Finally, in the case where it is used for control of an 8 cylinder engine, two LSI are used, the channels 1 to 4 of each LSI are used as igniter drivers, the channels 5a to 5j, 6a to 6j and the channels 7 to n are used as drivers of a low voltage load other than a usual solenoid, a heater, a relay, etc. Further, the channels 5a to 5j, 6a to 6j can be used as a full bridge for driving a throttle motor as in FIG. 26.

As mentioned above, according to the present embodiment, drivers of different withstand voltage are mixed and disposed on the same chip, in addition, the same kind of LSI can be effectually used commonly to control for a 4 cylinder engine, 6 cylinder engine or 8 cylinder engine, so that it is possible to reduce a development cost and a production cost by a mass production effect. Further, in the case where one channel of injector driver of a high withstand voltage is used as a low withstand voltage driver, it can be used as 10 channels, in addition, the on-resistance can be reduced to ¹⁄₁₀.

FIG. 30 shows an example of specification of drivers LSI suitable for driving apparatus of electric equipment for a vehicle, and for explanation of a using method thereof. In recent years, power consumption of the electric equipment increases, and some of automobiles have taken regenerative brake. Therefore, it is proposed to increase voltage of an electric system of each vehicle to 42 V which is three times 14V (12V) (nominal voltage 12 V, charging termination voltage 14V) which has been taken. FIG. 30 show an example of LSI which can be used both for a 14V(12)V system and for a 42V system, employing the present invention.

In FIG. 30, the channels 1a, 1b, 2a, 2b . . . na, na each has withstand voltage of 40V. The channels 1a, 2a . . . , na each are realized by a transistor 2 insulated by a trench 4. The channels 7 to n each are constructed from a transistor (MOSFET) not insulated as the transistor 3' in FIG. 10.

In a vehicle in which an electric system has 14V (12V), the channels 1a, 1b, 2a, 2b . . . , na, nb each are used independently as a driver. In this case, the withstand voltage of each channel is 40V and the on-resistance is 0.3 ohm. Further, in a vehicle in which an electric system has 42V, the channels 1a and 1b, 2a and 2b . . . na and nb each are connected to each other in series to secure withstand voltage (80V) necessary for the electric system. In this case, the withstand voltage and on-resistance of each channel are 70V and 0.8 ohm, respectively, which are twice as high as the above-mentioned those. Further, in a vehicle in which an electric system of 14V(12V) and an electric system of 42V are mixed in use, it is satisfied by connecting the channels 1a and 1b, 2a and 2b . . . , (n−1)a and (n−1)b in series, respectively, connecting them to the electric system of 42V and connecting dependently each of the channels na, nb to the electric system of 14V(12V). In this manner, according to the present embodiment, it can be used both for the electric system of 14V(12V) and for the electric system of 42V by LSI of the same specification, and it is possible to reduce the production cost by a mass production effect. Further, it is possible to realize on-resistance corresponding to withstand voltage, that is, a large on-resistance for a channel of a high withstand voltage and a small on-resistance for a channel of low withstand voltage.

Figure 31:
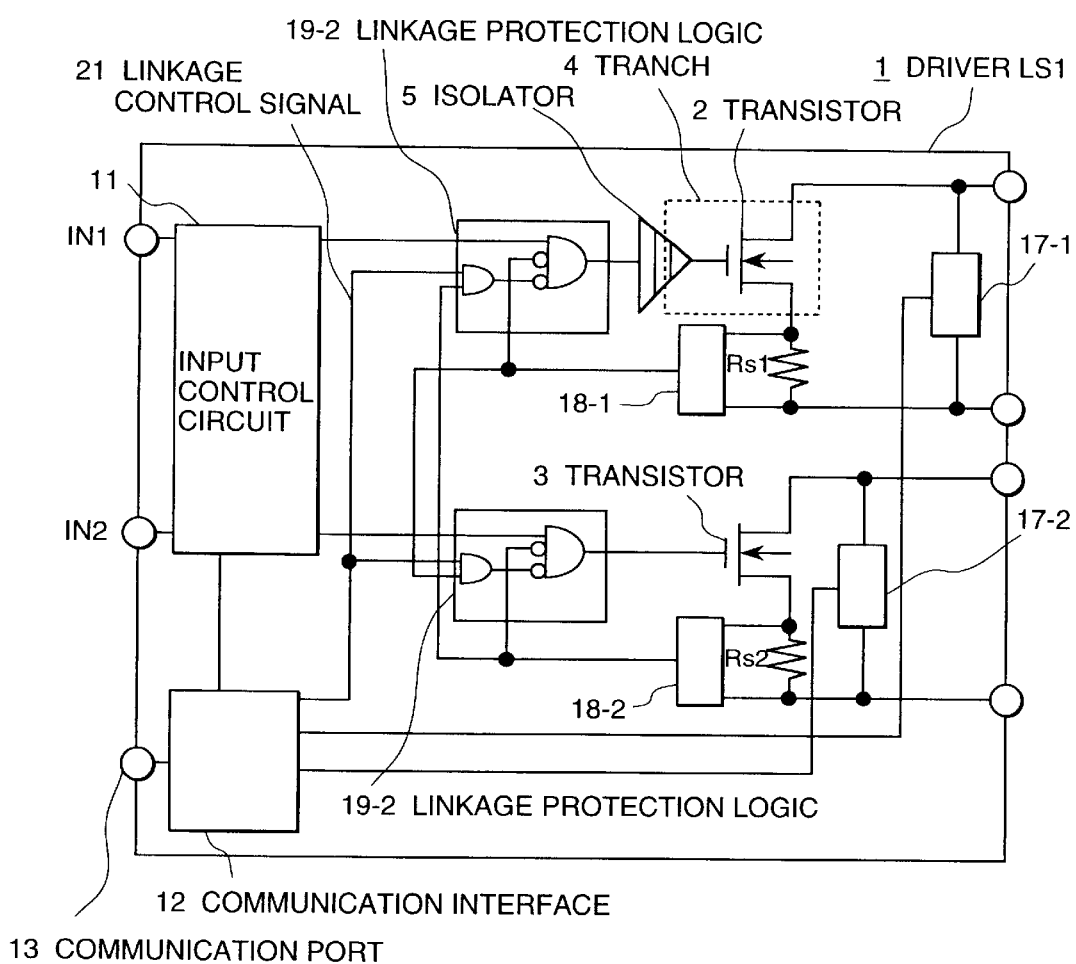
FIG. 31 is a diagram showing an example in which a protective function is added to a driver LSI.
Figure 32:
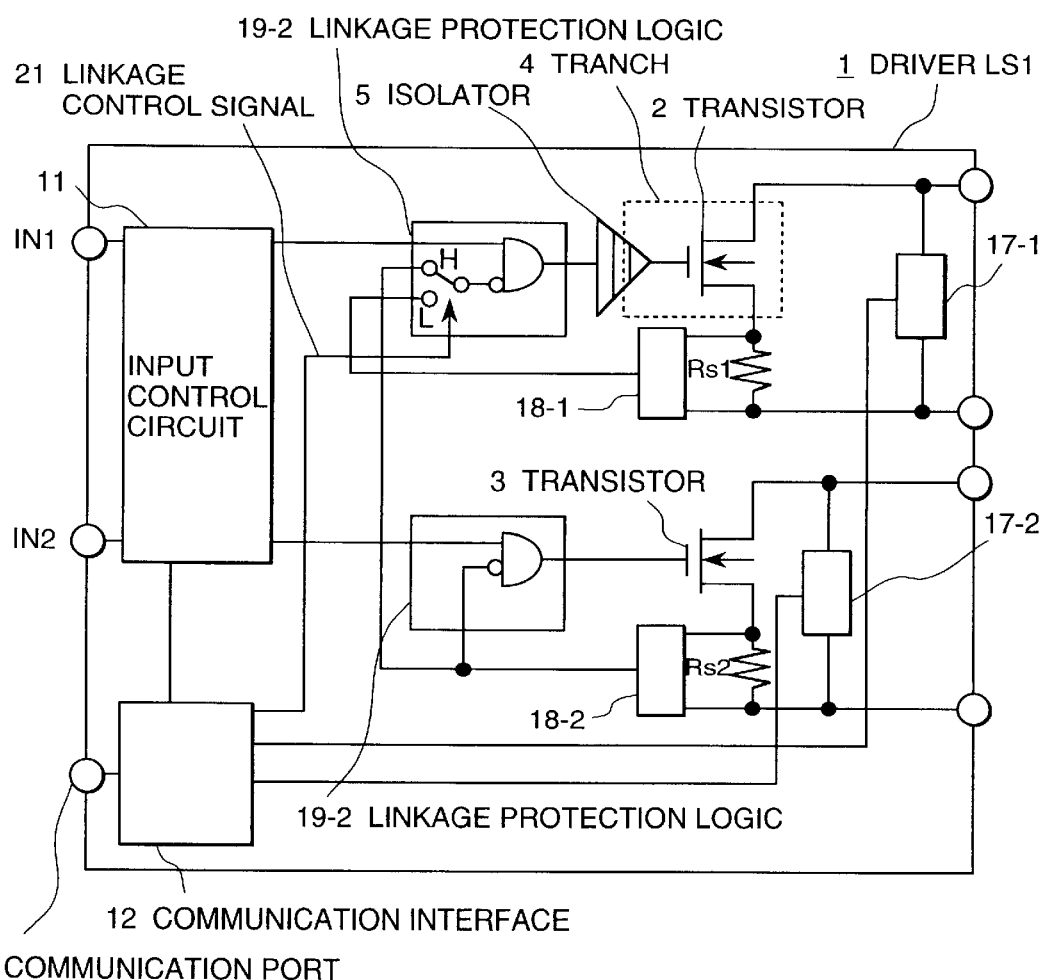
FIG. 32 is a diagram showing another example in which a protective function is added to a driver LSI.

FIGS. 31 and 32 show an example in which a protective function is added to a driver LSI. Voltage detecting means 17-1, 17-2 each monitor voltage between a drain and a source of a transistor 2, 3, and detect line breakage of a load, power supply fault (short circuit between a hot side of the load and the power supply in a high side driver) and ground fault (short circuit between a cold side of a load and the ground in a low side driver). On a normal condition, when a transistor is turned on, voltage between the drain and the source becomes low and when the transistor is turned off, the voltage between the drain and the source becomes high. By utilizing the fact, at time of the line breakage of load, the power supply fault and the ground fault, the voltage between the drain and the source does not become large even if the transistor is turned off, it is possible to detect them by monitoring the voltage between the drain and the source. Further, at the time of the line breakage of load, the power supply fault and the ground fault, they are informed to a microprocessor, etc, out of the system through the communication interface 12 and the communication port 13.

Current detecting means 18-1, 18-2 each monitor voltage between both ends of current detection resistors Rs1, Rs2 connected to the drain or the source of each transistor 2, 3, thereby to measure current and detect over current due to line breakage of a load, power supply fault (short circuit between a hot side of the load and the power supply in a high side driver) and ground fault (short circuit between a cold side of a load and the ground in a low side driver). At time of detection of over current, they are informed to a microprocessor, etc. out of the system through the communication interface 12 and the communication port 13, and turn off the transistors 2, 3 by linkage protection logic 19-1, 19-2, thereby to protect from breakage.

The linkage protection logic 19-1, 19-2 operate linkage protection on the basis of linkage control signals 21. In the case where the linkage protection is needed, that is, in the case where the transistors 2, 3 are being connected in series, over current is detected by any one of the current detecting means 18-1, 18-2, both of the transistors 2, 3 are turned off. Further, in the case where the linkage protection is unnecessary, that is, in the case where the transistors 2, 3 are not connected in series, when over current is detected by the current detecting means 18-1, only the transistor 2 corresponding thereto is turned off, and when over current is detected by the current detecting means 18-2, only the transistor 3 corresponding thereto is turned off.

In this manner, transistors used singly or connected in series can be protected according to their using methods.

Further, in FIGS. 31, 32, examples in which it is applied to the driver LSI having an output port for one channel are shown for simplicity, however, it is possible to apply it to the driver LSI having output ports for plural channels. Particularly, as in the examples shown in FIGS. 27 to 29, it is matter-of-course that it can be applied to the driver LSI having output ports for channels of the optimum number for construction of the engine controllers.

Figure 33:
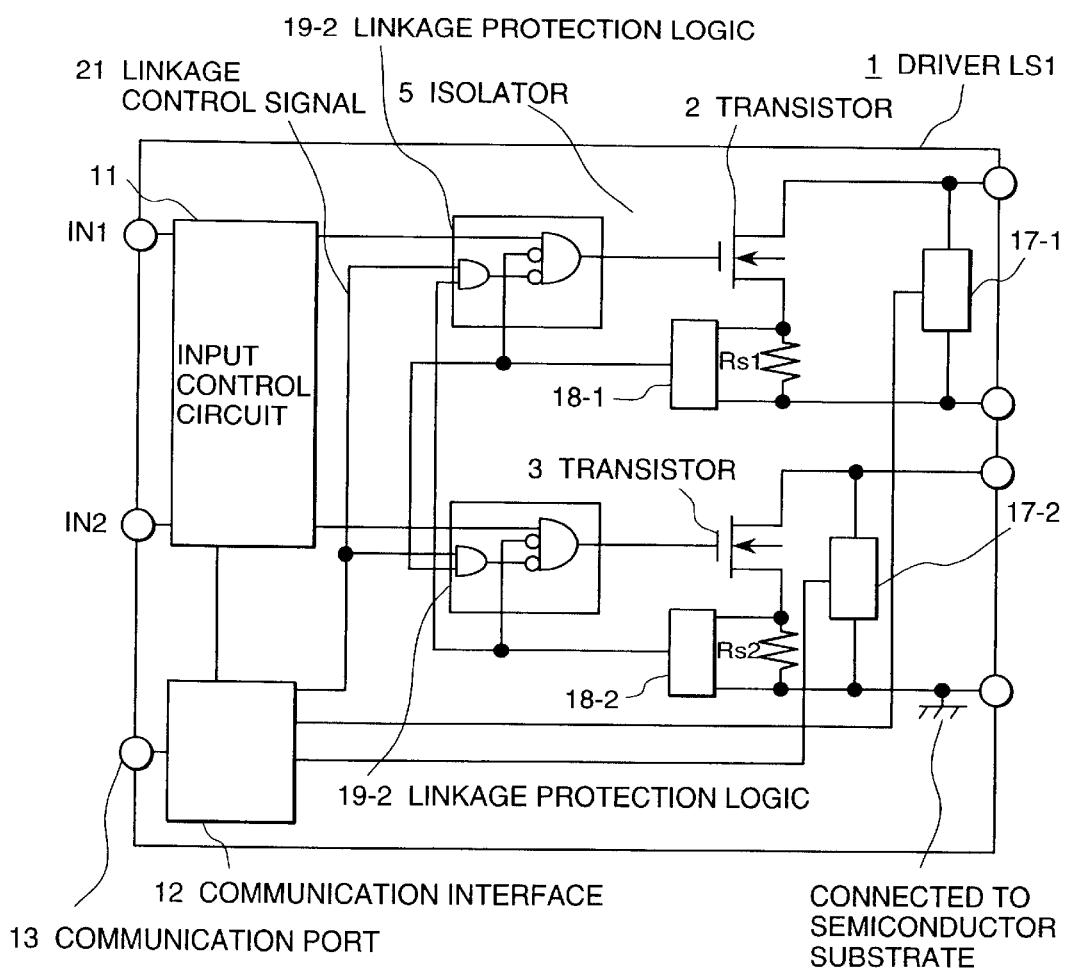
FIG. 33 is a diagram showing a twelfth embodiment.

FIG. 33 shows a twelfth embodiment in which transistors are connected in series without any trench 4 and isolator 5 to raise withstand voltage. In the above-mentioned examples, the transistor 2 is insulated by the trench 4 and the isolator 5 to secure withstand voltage when it is connected in series. However, if insulation between the transistor 2 and the semiconductor substrate on which the transistor is formed is sufficient, the withstand voltage when it is connected in series can be raised without the trench 4 and the isolator 5. As a construction for obtaining the withstand voltage between the above-mentioned transistor and the semiconductor substrate on which the transistor is formed, it is possible to take a method of isolating by conventional pn-junction (U.S. Pat. No. 5,434,531), for instance. However, in this case, it is difficult to obtain withstand voltage of 400V or higher.

Further, in the case where the above-mentioned isolating method is taken, a semiconductor substrate of a driver LSI is connected to an output terminal on the side of cathode (source) side of the transistor 3 for stabilizing the potential. Therefore, in the case where it has an output port for plural channels by the transistor 3, an output terminal on the cathode (source) side of plural channels is commonly connected to a semiconductor substrate of the driver LSI. However, since any output terminal should be made independent so that the output port by the transistor 2 can be connected in series, it can not be connected to the semiconductor substrate and other output terminal(except for the case where a plurality of terminals are connected in parallel because of restriction of current capacity). Further, the transistor 2 is disposed in higher potential than the transistor 3, so that it becomes necessary in some cases to drive the gate by sufficiently high voltage by using a charge pump so as to saturate when turned on.

As mentioned above, according to the present invention, since drivers of different withstand voltage can be formed on the same chip, it is possible to integrate drivers having various different withstand voltage. Further, since withstand voltage of various values can be realized by connecting in series the necessary number of transistors for drivers, drivers of minimum on-resistance and minimum size under the required withstand voltage can be designed. Further, since drivers of various withstand voltage and types can be realized, it is possible to achieve a wider use of LSI integrating drivers and reduce a cost by a mass production effect, too.

According to the present invention, it is possible to integrate a plurality of semiconductor drivers having different withstand voltage on the same chip, whereby it is possible to make small the size of apparatuses using power semiconductors and to reduce the cost.

What is claimed is:

1. A semiconductor device comprising:

an embedded insulation layer formed in a semiconductor substrate;

a plurality of power semiconductor elements formed on said semiconductor substrate;

a trench isolating between said plurality of power semiconductor elements formed on said semiconductor substrate on said embedded insulation layer;

an isolator insulating and driving control electrodes of said power semiconductor elements; and wherein said plurality of power semiconductor elements are connected in series and each has constant voltage elements connected in parallel, and a load is connected to one end of said plurality of power semiconductor elements connected in series.

2. A semiconductor device comprising:

an embedded insulation layer formed in a semiconductor substrate;

a plurality of power semoconductor elements formed on said semiconductor substrate;

a trench isolating between said plurality of power semiconductor elements formed on said semiconductor substrate on said embedded insulation layer;

an isolator insulating and driving control electrodes of said power semiconductor elements; and wherein said plurality of power semiconductor elements are connected in series and each has constant voltage elements connected in parallel between electrode on one side and said control electrode, and a load is connected to one end of said plurality of power semiconductor elements connected in a series.

3. A semiconductor device according to claim 1, characterized in that said plurality of power semiconductor elements drive an ignition coil.

4. A semiconductor device according to claim 2, characterized in that said plurality of power semiconductor elements drive an ignition coil.

5. A semiconductor device according to claim 1, characterized in that said plurality of power semiconductor elements drive a fuel injection valve.

6. A semiconductor device according to claim 2, characterized in that said plurality of power semiconductor elements drive a fuel injection valve.

7. A semiconductor device according to claim 2, characterized in that said plurality of power semiconductor elements have an input control circuit supplying a control signal of a specific control pattern to said control electrodes of said plurality of power semiconductor elements on the base of input signals.

8. A semiconductor device according to claim 3, characterized in that said plurality of power semiconductor elements have an input control circuit supplying a control signal of a specific control pattern to said control electrodes of said plurality of power semiconductor elements on the base of input signals.

9. A semiconductor device characterized by comprising an embedded insulation layer formed in a semiconductor substrate;

a trench isolating between a plurality of power semiconductor elements formed on the semiconductor substrate on said embedded insulation layer and said power semiconductor elements; and an isolator insulating and driving control electrodes of said power semiconductor elements, said power semiconductor elements comprising a plural pairs of high withstand voltage power semiconductor elements composed of elements isolated by trenches and elements not isolated by trenches, and low withstand voltage power semiconductor elements composed of only elements not isolated by trenches.

10. A semiconductor device according to claim 10, characterized in that said plural pairs of high withstand voltage power semiconductor elements form a bridge circuit.

11. A semiconductor device according to claim 10, characterized in that said plural pairs of high withstand voltage power semiconductor elements form an injector circuit.

* * * * *